United States Patent [19]

Takahara et al.

[11] Patent Number: 5,493,710
[45] Date of Patent: Feb. 20, 1996

[54] COMMUNICATION SYSTEM HAVING OSCILLATION FREQUENCY CALIBRATING FUNCTION

[75] Inventors: Yasuaki Takahara, Yokohama; Shigeyuki Sudo, Fujisawa, both of Japan

[73] Assignee: Hitachi, Ltd., Tokyo, Japan

[21] Appl. No.: 923,573

[22] Filed: Aug. 3, 1992

[30] Foreign Application Priority Data

Aug. 2, 1991 [JP] Japan ................................. 3-194202
Dec. 12, 1991 [JP] Japan ................................. 3-329055

[51] Int. Cl.$^6$ ................................................. H04B 1/16
[52] U.S. Cl. ..................... 455/192.2; 455/75; 455/182.2; 455/259; 455/265
[58] Field of Search .......................... 455/75, 76, 192.1, 455/192.2, 255, 256, 257, 258, 259, 265, 254, 70, 71, 196.1, 67.4, 83, 182.1, 182.2, 208, 232.1, 63, 296

[56] References Cited

U.S. PATENT DOCUMENTS

| | | | |
|---|---|---|---|
| 4,932,072 | 6/1990 | Toko | 455/76 |
| 5,073,973 | 12/1991 | Ylivakeri | 455/76 |
| 5,101,509 | 3/1992 | Lai | 455/254 |
| 5,115,515 | 5/1992 | Yamamoto et al. | 455/265 |

FOREIGN PATENT DOCUMENTS

| | | |
|---|---|---|
| 63-26020 | 2/1988 | Japan . |
| 63-281526 | 11/1988 | Japan . |
| 2-46044 | 2/1990 | Japan . |

Primary Examiner—Reinhard J. Eisenzopf
Assistant Examiner—Nguyen Vo
Attorney, Agent, or Firm—Antonelli, Terry, Stout & Kraus

[57] ABSTRACT

A communication system which includes a receiving section having a frequency convertor for converting a received signal into an intermediate frequency signal by mixing with a local oscillation signal, and a demodulator for demodulating the received signal converted into the intermediate frequency signal, a transmission section for modulating a transmission signal received thereby, to transmit the so modulated signal, and an input/output section for receiving the demodulated signal from the receiving section and outputting it externally and receiving the transmission signal externally and outputting it to the transmission section. The receiving section includes a local oscillator for generating the local oscillation signal, reference frequency generator for generating a reference signal, calibration signal generator for generating a calibration signal having a predetermined frequency based upon the reference signal, to input the calibration signal to the frequency converter, counter for counting the frequency of the intermediate frequency signal, and corrector for detecting a frequency error based upon the counted value of the intermediate frequency signal. The frequency converter converts the calibration signal into the intermediate frequency signal by mixing with the local oscillation frequency. The counter counts the frequency of the calibration signal converted by the frequency converter as the intermediate frequency signal. The corrector detects the frequency error from a frequency difference between the counted value of the calibration signal and a predetermined intermediate frequency reference value, thereby generating a signal for frequency correction based upon the thus detected frequency error.

17 Claims, 20 Drawing Sheets

F I G. 7
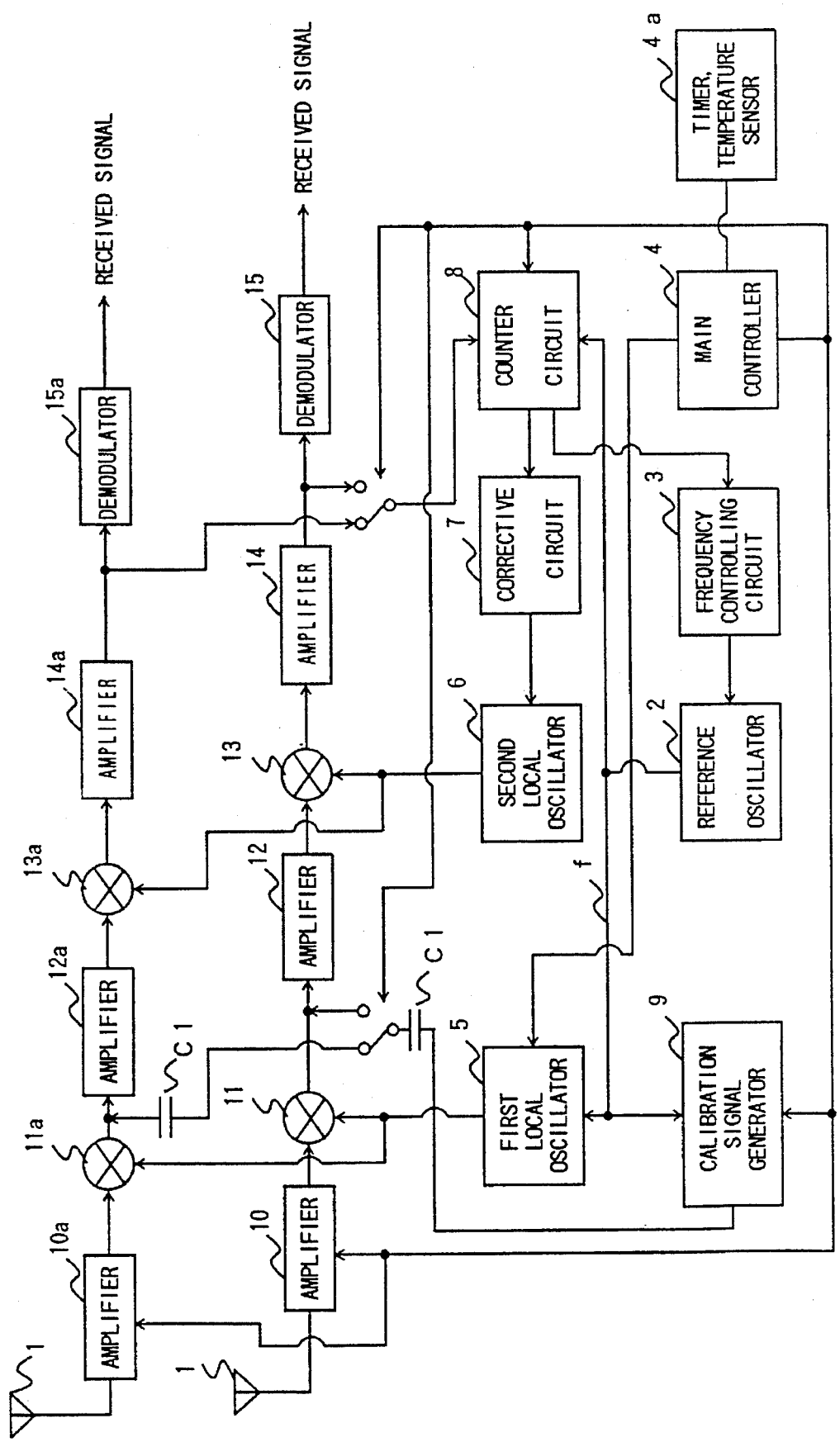

OUTPUT BY FREQUENCY ESTIMATOR 311

COMMUNICATION SYSTEM HAVING OSCILLATION FREQUENCY CALIBRATING FUNCTION

BACKGROUND OF THE INVENTION

1. Field of the Invention

The present invention relates to a receiving system or a mobile communications system which has a frequency stabilizing function to control a frequency stability to a predetermined value. More particularly, this invention relates to a communication system using a heterodyne receiving system, i.e., a communication system having a function of calibrating the frequency of a reference signal which is to be a reference of transmitting/receiving frequencies, which is applicable to a digital automatic telephone.

2. Description of Related Art

Prior techniques of improving the accuracy of the transmitting/receiving frequencies in a mobile communications system are disclosed in Japanese Patent Laid-Open Publication (KOKAI) Nos. 63-26020 and 63-28156. In these prior techniques, the frequency of a transmission signal is automatically settled within a predetermined range by converting a stable frequency of a received signal transmitted from a base station into a second intermediate frequency signal and then counting the frequency of the second intermediate frequency signal by means of a counter device so as to obtain a difference between the counted value and a predetermined second intermediate frequency reference value. According to the difference, an oscillation frequency control signal is issued by an operation controlling device to a VC-TCXO (Voltage Controlled Temperature Compensated Crystal Oscillator).

To obtain the frequency more accurately, the frequency of a second local oscillator is also counted by the counter device, and a frequency error of the second local oscillator is made to be corrected based upon the counted value.

In the above mentioned automatic frequency control, the relationship between the estimate accuracy of the frequency error based on the counted value and time required for counting is reciprocal. If the accuracy of an oscillator which is a time base of the counter device is sufficiently high, in principal, an error of nearly 10 Hz is estimated in a 100 ms count period.

On the other hand, in the digital automatic telephone system, microwave digital communication by time division multiplex communication has been in practical use in recent years. As a prior technique relating to a demodulator suitable for time-division multiplex communication, it is commonly known to use a demodulator with quasi-coherent demodulator which vector-demodulates with respect to a continuous phase modulating wave having a constant amplitude by use of a fixed reference carrier so as to obtain a quasi-coherent demodulation signal, as disclosed in, for example, Japanese Patent Application Laid-Open is (KOKAI) 2-46044. In this prior demodulator, a phase rotating signal caused by carrier drift owing to fading and relative deviation between the oscillation frequency of a base station and the fixed reference carrier. The frequency error of the fixed reference carrier wave is estimated by an operation method in which primary approximation is performed with respect to the accumulation of the phase rotation. This estimate processing is performed at one time with respect to burst data, and hence it is completed at high speed within the time required for operational processing started from the reception of the burst data.

In a receiver or a mobile communication system in which receiving frequency stability is required, it is essential to maintain a reference frequency in a predetermined range without controlling the system for a long time period, i.e., for five or ten years. Further, in a mobile communication, it is essential to improve the accuracy of the transmitting frequency, as further even narrower frequency bands come into use.

In the prior art techniques, there is provided a VC-OCXO to be controlled based on the receiving frequency, and the oscillation frequency of the VC-TCXO is fine-controlled on the basis of the received signal so as to obtain the desired frequency stability. Also, the frequency of a second local oscillator can be counted by switching the mode, and the oscillation frequency of the second oscillator is corrected using the counted value, which makes it possible to control the frequencies to a high accuracy of within 1 ppm.

On the other hand, however, there is a need for low power consumption in the receiver of the mobile communication system.

In the prior techniques, low power consumption cannot be achieved owing to a frequency estimator and an amplifier. The former counts high frequency which is the output from the second local oscillator, and the latter amplifies the second local oscillation frequency signal so that it can be counted by the counter.

For example, it is assumed that a first intermediate frequency is 90 MHz, and the second intermediate frequency is 455 kHz. The oscillation frequency of the second local oscillator therefore becomes 89.545 MHz, which is the threshold frequency in a CMOSIC. Taking into consideration the need for lower power consumption, this frequency exceeds the operational threshold frequency, which cannot be adequately dealt with in the CMOSIC.

Further, in the time division communication in which the operation should be performed in the burst mode, high-speed processing is required in an automatic frequency control system. The counter requires a relatively long time for counting, which makes it unsuitable for the automatic frequency control system. Therefore, it has been suggested to provide an automatic frequency control in which the estimated result is fedback to the VC-TCXO in the demodulation system having the quasi-coherent demodulator and operational device for estimating the frequency error. However, the estimate of the frequency error is executed with respect to the output of the quasi-coherent demodulator. In the mobile communication system employing the double super heterodyne system, the frequency error is estimated by the value accumulated with deviation factors such as the deviation of VC-TCXO, the frequency variations of the second local oscillator and the fixed reference carrier generator, carrier drift caused by high-speed fading, etc., and hence, it is difficult to obtain only the variation of the VC-TCXO accurately. In particular, a relatively cheap oscillator is used as the second local oscillator in the mobile telephone. When the estimated result estimated from the accumulated value is fedback directly, the accuracy of the transmission frequency relative to the base station is deteriorated. For example, when it is assumed that the first intermediate frequency is 90 MHz in the mobile telephone system in the 900 MHz band, and the frequency stability of the second local oscillator is 10 ppm, 900 Hz frequency error is obtained. When this is converted as the frequency error of 900 MHz, the deterioration is generated by 1 ppm. Taking into consideration the high-accurate of frequencies in recent years, this deteriorated value is not negligible.

To improve the accuracy of the transmission frequency, there may be provided an oscillator having a high performance as the second local oscillator, which is however not preferable in cost.

Further, it is difficult to make the counter into the LSI circuit owing to the high frequency to be counted, which reduces the level of minimization of the system. This is a serious problem particularly to a portable communication system required to be reduced in size, because it needs to be operated with a low voltage in order to reduce the number of cells.

Further, the second local oscillator has been included in the LSI circuit in recent years. To pick up the output of the second local oscillator securely, it is necessary to provide an amplifying circuit which gives no influence to the operation of the LSI. However, this leads to an increase in the number of circuits in the system, and is therefore not suitable for the portable type.

SUMMARY OF THE INVENTION

To solve the above mentioned problem, the present invention provides a communication system which can follow the frequency of the base station with high accuracy, taking into consideration the frequency error of the oscillator.

According to the first aspect of the present invention, there is provided a communication system which comprises a receiving section which includes at least one frequency converting device for converting a received signal into an intermediate frequency signal by mixing with a local oscillation signal, and a demodulator for demodulating the received signal converted into the intermediate frequency signal, a transmission section for modulating a transmission signal received thereby to transmit the so modulated signal, and an input/output section for receiving the demodulated signal from the receiving section and outputting it externally and receiving the transmission signal externally and outputting it to the transmission section. The receiving section includes at least one local oscillating device for generating the local oscillation signal, reference frequency generating device for generating a reference signal, calibration signal generating device for generating a calibration signal having a predetermined frequency on the basis of the reference signal, to input the calibration signal to the frequency converting device, counter device for counting the frequency of the intermediate frequency signal, and correcting device for detecting a frequency error on the basis of the counted value of the intermediate frequency signal. The frequency converting device converts the calibration signal, in addition to the received signal, into the intermediate frequency signal by mixing with the local oscillation frequency, and the counter device counts the frequency of the calibration signal converted by the frequency converting device as the intermediate frequency signal. The correcting device detects the frequency error from a frequency difference between the counted value of the calibration signal counted by the counter device, and a predetermined intermediate frequency reference value, thereby generating a signal for frequency correction on the basis of the thus detected frequency error.

The signal for frequency correction generated by the correcting device can be an oscillation frequency control signal, which is to be inputted to the local oscillating device, and the local oscillating device is controlled with respect to a frequency of the local oscillation signal on the basis of the oscillation frequency control signal. Further, the local oscillating device can include first local oscillating device for oscillating a frequency on the basis of the reference oscillation frequency generated from the reference frequency generating device and second local oscillating device for generating the local oscillation signal. The frequency converting device may include first and second frequency converting device, which correspond to the first and second local oscillating device, respectively, for mixing the received signal with the respective local oscillation signals to convert them into first and second intermediate frequency signals, respectively. The second frequency converting device may convert, in addition to the received signal, the calibration signal which is converted into the first intermediate frequency signal or corresponds to the first intermediate frequency, into a second intermediate frequency signal by mixing with the oscillation signal oscillated by the second oscillating device. The counter device may count the calibration signal converted into the second intermediate frequency signal by the second frequency converting device, and the correcting device may detect a frequency error between the counted value of the calibration signal converted into the second intermediate frequency signal which is counted by the counter device, and the predetermined intermediate frequency reference value, to thereby generate a signal for frequency correction on the basis of the thus detected frequency error.

In the communication system as described, the calibration signal generating device can generate the calibration signal having a predetermined frequency to output it before the first frequency converting device. The first frequency converting device converts the calibration signal into the first intermediate frequency signal by mixing with the local oscillation signal oscillated by the first local oscillating device, and the second frequency converting device converts the calibration signal converted into the first intermediate frequency signal into the second intermediate frequency signal by mixing with the local oscillation signal oscillated by the second local oscillating device.

The communication system may further include frequency controlling device for outputting the oscillation frequency control signal to the reference frequency generating device on the basis of the frequency error between the counted value of the calibration signal converted into the second intermediate frequency signal and the intermediate frequency reference value, which is detected by the counter device. The reference frequency generating device is controlled with respect to the frequency of the reference oscillation signal on the basis of the oscillation frequency control signal.

The communication system may further include controlling device for instructing the calibration signal generating device to activate generation of the calibration signal, and a temperature sensing device for instructing the calibration signal generating device to activate generation of the calibration signal. The controlling device instructs the calibration signal generating device to activate generation of the calibration signal at a regular period of time. The controlling device monitors whether or not communication is being carried out in the communication system and issues a command for generating the calibration signal to the calibration signal generating device when the communication is not being carried out.

According to the second aspect of the present invention, there is provided a mobile communications system which comprises a receiving section which includes first and second local oscillating device each for generating local oscillation signal, first and second frequency converting device each for converting a received signal into an intermediate frequency signal by mixing with the corresponding local oscillation signal, reference frequency oscillating device for generating a reference signal having a predetermined reference frequency, calibration signal generating device for generating a calibration signal on the basis of the reference signal generated from the reference frequency oscillating device, and a demodulator for demodulating the received signal converted into the intermediate frequency signals, a transmission section for modulating a transmission signal received thereby to transmit the so modulated signal, and an input/output section for receiving the demodulated signal and outputting the transmission signal. The reference oscillating device is controlled on the basis of the received signal, and the first local oscillating device oscillates on the basis of the so controlled reference frequency oscillating device. The calibration signal generating device generates the calibration signal which is controlled on the basis of the reference signal generated by the controlled reference frequency oscillating device, and the second oscillating device is corrected on the basis of an oscillation frequency control signal which is determined on the basis of the frequency difference between the intermediate frequency reference value and the counted value of the controlled calibration signal, which is generated by the calibration signal generating device and inputted to the second frequency converting device to be converted into a second intermediate frequency signal.

The mobile communication system may include selector device for selecting either one of the output of the received signal and the output of the calibration signal, or vice versa.

According to the third aspect of the present invention, there is provided a calibration method comprising the steps of oscillating a reference signal having a predetermined reference frequency, controlling the reference frequency of the reference signal on the basis of a received signal externally, generating a calibration signal on the basis of the so controlled reference signal, oscillating a local oscillation signal having a predetermined local oscillating frequency, converting the calibration signal into an intermediate frequency signal by mixing with the local oscillation signal, counting the calibration signal converted into the intermediate frequency signal, and detecting a frequency error between an intermediate frequency reference value and the counted value of the calibration signal converted into the intermediate frequency signal, thereby correcting a local oscillation frequency of the local oscillation signal on the basis of the frequency error.

According to the fourth aspect of the present invention, there is provided a communication system comprising a receiving section which includes first frequency converting device for converting a received signal into a first intermediate frequency signal by mixing with a first local oscillation signal, second frequency converting device for converting the received signal converted into the first intermediate frequency signal into a second intermediate frequency signal by mixing with a second local oscillation signal, and a demodulator for demodulating the received signal converted into the intermediate frequency signal; a transmission section for modulating a transmission signal received thereby, to transmit the so modulated signal, and an input/output section for receiving the demodulated signal from the receiving section and outputting it externally and receiving the transmission signal externally and outputting it to the transmission section. The receiving section include a reference frequency generating device for generating a reference signal, a calibration signal generating device for outputting a calibration signal of the first intermediate frequency on the basis of the reference signal, and a frequency estimating and correcting device for detecting a frequency error of the reference frequency generating device and outputting an oscillation frequency control signal to the reference frequency generating device on the basis of the so detected frequency error. The reference frequency generating device is controlled on the basis of the oscillation frequency control signal, with respect to an oscillation frequency of the reference signal. The second frequency converting device converts, in addition to the received signal converted into the first intermediate frequency signal, and the calibration signal converted into the first intermediate frequency into a second intermediate frequency signal by mixing with the second local oscillation signal. The frequency estimating and correcting device detecting a frequency error A between the calibrating signal converted into the second intermediate frequency and a predetermined reference intermediate frequency, further detecting a frequency error C which is determined by eliminating the frequency error A from a frequency error B which is a frequency difference between the received signal converted into the second intermediate frequency and the intermediate frequency, to thereby output an oscillation frequency control signal on the basis of the thus detected frequency error C.

The frequency estimating and correcting device may include a first frequency estimator for detecting the frequency error A between to be outputted, a phase compensator for correcting an phase of the received signal converted into the second intermediate frequency on the basis of the frequency error A detected by the first frequency estimator, a second frequency estimator for detecting the frequency error C and outputting a frequency error signal on the basis of the frequency error C, and a frequency correcting device for outputting the oscillation frequency control signal to the reference frequency generating device on the basis of the frequency error signal outputted from the second frequency estimator. The second frequency estimator detecting the frequency error C on the basis of the received signal corrected by the phase compensator and the intermediate frequency.

Further, the frequency estimating and correcting device may include a first frequency estimator for detecting the frequency error A to be outputted, a second frequency estimator for detecting the frequency error B and outputting to be outputted, and a frequency correcting device for detecting the frequency error C to output the oscillation frequency control signal to the reference frequency generating device on the basis of the detected frequency error C. The frequency correcting device can detect the frequency error C on the basis of the frequency error A outputted from the first frequency estimator and the frequency error B outputted from the second frequency estimator.

The phase compensator further may include a mode in which a phase of the received signal converted into the second intermediate frequency is corrected and an another mode in which the received signal is outputted without being corrected, and selector device for selecting either one of the modes. In this case, the frequency correcting device detects the frequency error C according to the selected mode and outputting the oscillation frequency control signal to the reference frequency generating device.

In the communication system as described above, the frequency estimating and correcting device may includes a frequency estimator for detecting the frequency error A a frequency memory for storing the frequency error A, a phase compensator for compensating a phase of the received signal converted into the second intermediate frequency, on the basis of the frequency error A stored in the frequency memory, and a frequency correcting device for outputting the oscillation frequency control signal to the reference frequency generating device. The frequency estimator can detect the frequency error C on the basis of the received signal corrected with the phase compensator and the reference intermediate frequency to output a frequency error signal, and the frequency correcting device outputs the oscillation frequency control signal to the reference frequency generating device on the basis of the frequency error signal.

In the above mentioned communication system, the frequency estimating and correcting device can detect the frequency error C in such a manner that the frequency error B is initially detected, and the frequency error C is detected by subtracting the frequency error A from the frequency error B. Or, the frequency estimating and correcting device can detect the frequency error C such that a phase of the received signal is corrected on the basis of the frequency error A, and the frequency error C is detected on the basis of the so corrected received signal and the predetermined reference intermediate frequency.

BRIEF DESCRIPTION OF THE DRAWINGS

FIG. 7 is a block diagram showing the structure of a communication system according to the fifth embodiment of the present invention;

DETAILED DESCRIPTION OF THE PREFERRED EMBODIMENTS

Figure 1:
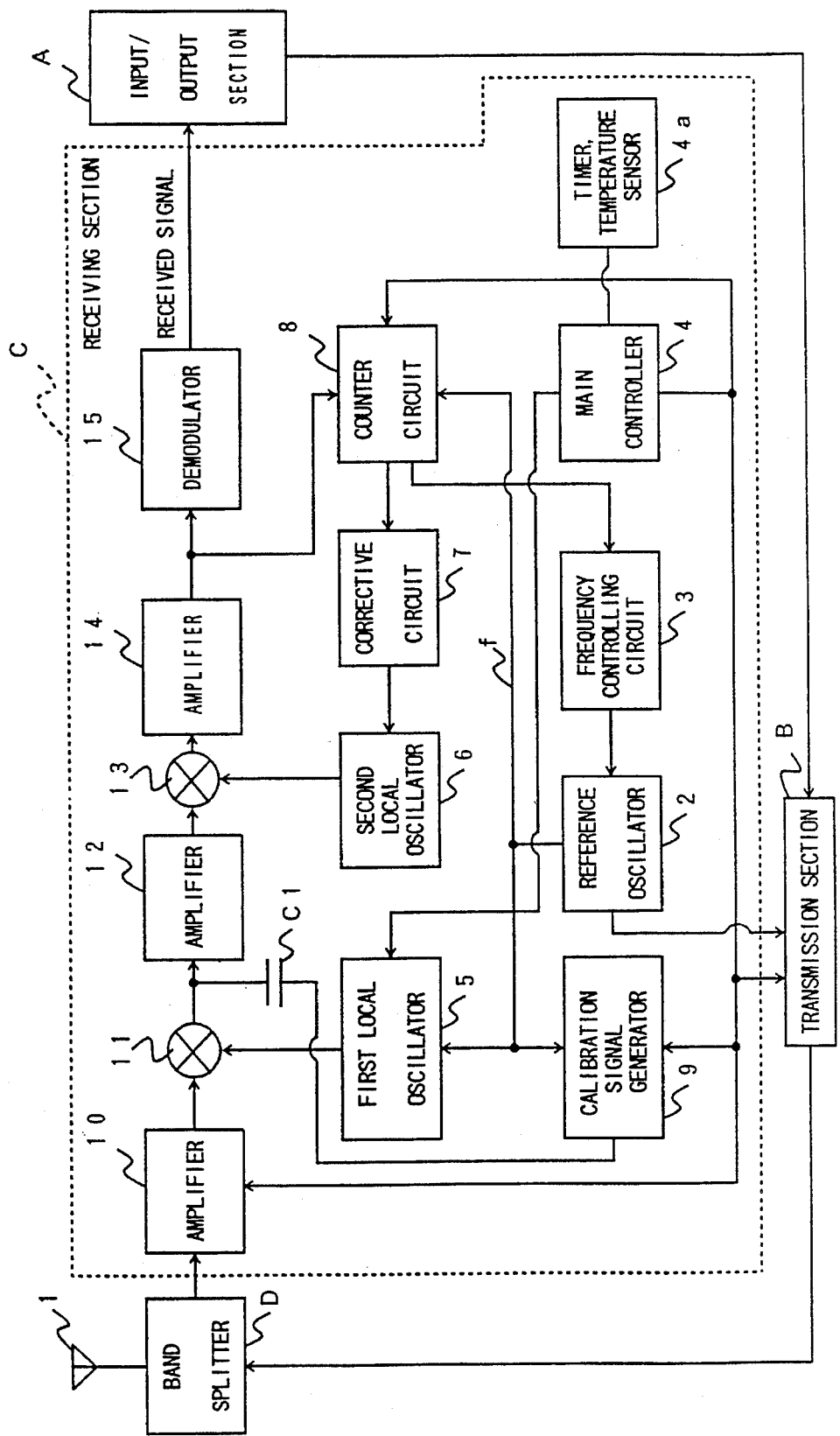
FIG. 1 is a block diagram showing the structure of a communication system according to the first embodiment of the present invention.

FIG. 1 shows the structure of a communication system according to the first embodiment of the present invention. The communication system shown in FIG. 1 comprises a receiving section C for receiving a signal, a transmission section B for modulating the received signal to transmit the modulated signal, an input/output section A for accepting the demodulated signal from the receiving section and outputting it externally and accepting an external transmission signal and outputting it to the transmission section, a band splitter D for splitting the reception and transmission signals, and an antenna 1. In FIG. 1, a reference oscillator 2 having a frequency controlling function, outputs a reference signal f, a main controller 4 controls the entire communication system, a first local oscillator 5 determines an oscillation frequency based upon the reference signal f outputted by the reference oscillator 2, a second local oscillator 6 has a frequency controlling function, and each of amplifiers 10, 12, and 14 amplifies the received signal. A first frequency converter 11 combines the signal received by the antenna 1 with the oscillation frequency set by the first local oscillator 5 so as to convert them to a first intermediate frequency signal, and a second frequency converter 13 combines the first intermediate frequency signal with the oscillation frequency controlled by the second local oscillator 6 so as to convert them to a second intermediate frequency signal. A counter circuit 8 counts the frequency of the second intermediate frequency signal, and a calibration signal generator 9 generates a calibration signal based upon the reference signal f outputted by the reference oscillator 2, and the frequency of the calibration signal is the same as the first intermediate frequency signal. A frequency controlling circuit 3 which compares the value counted by the counter circuit with a predetermined value which is an ideal second intermediate frequency (hereinafter, referred to as a second intermediate frequency reference value), to output a frequency control signal based upon the comparison result, to the reference oscillator 2 so as to coincide the counted value with the second intermediate frequency reference value. A corrective circuit 7 compares the value counted by the counter circuit with the second intermediate frequency reference value, to output a frequency control signal based upon the comparing result, to the second local oscillator 6 so as to coincide the counted value with the second intermediate frequency value.

The receiving section C includes the amplifiers 10, 12, and 14, the first frequency converter 11, the second frequency converter 13, a demodulator 15, the first local oscillator 5, the second local oscillator 6, the frequency corrective circuit 7, the counter circuit 8, the calibration signal generator 9, the reference oscillator 2, the frequency controlling circuit 3, and the main controller 4. The reference oscillator 2 and the main controller 4 can be commonly used by the receiving section C and the transmission section B.

The operation will now be described.

The operation of controlling the oscillation frequency of the reference oscillator 2 using the received signal will be described.

The signal received by the antenna 1 is initially converted into the second intermediate frequency signal through the first and second frequency converters 11 and 13. The second intermediate frequency signal is counted in frequency by the counter circuit 8, and the thus counted value is transmitted to the frequency controlling circuit 3, where the counted value is compared with the second intermediate frequency reference value to output the frequency control signal to the reference oscillator 2 on the basis of the comparing result.

The frequency control signal will be determined by the operational processings described in the following.

The frequency difference between the counted value and the second intermediate frequency reference value is initially controlled. Next, if [counted value]>[second intermediate frequency reference value], the frequency control signal is controlled such that the oscillation frequency of the reference oscillator 2 is increased. By this controlling operation, the frequency of the first local oscillator is controlled to be high, and the difference from the frequency of the received signal is accordingly reduced. As a result, the frequency of the second intermediate frequency signal is decreased, and the counted value is reduced.

On the contrary, if [counted value]<[second intermediate frequency reference value], the frequency control signal is controlled such that the oscillation frequency of the reference oscillator 2 is decreased. By this operation, the frequency of the first local oscillator is controlled to be low, and the difference from the frequency of the received signal is accordingly increased. As a result, the frequency of the second intermediate frequency signal becomes high, and the counted value is increased.

In this first embodiment of the present invention, with respect to the degree of control of the frequency control signal, the correction factor is changed according to the frequency difference. If the frequency difference is large, for example, the degree of control is set to be broad. This enables the operational speed to increase.

By the operation described above, the frequency of the second intermediate frequency signal is controlled to be close to the second intermediate reference frequency.

The operation of correcting the oscillation frequency of the second local oscillator 6 will now be described.

Upon receipt of the instruction from the main controller 4, the calibration signal generator 9 generates the first intermediate frequency signal as the reference signal f. The calibration signal generated by the calibration signal generator 9 is inputted via a coupling capacitor C1 and the amplifier 12 into the second frequency converter 13. In the second frequency converter 13, the calibration signal is combined with the signal generated by the second local oscillator 6 to be converted into the second intermediate frequency signal. This second intermediate frequency signal is counted in frequency by the counter circuit 8, to output the counted value to the second local oscillator 6. The operation of the corrective circuit 7 is the same as that of the frequency controlling circuit 3 previously described, but the correction factors are different in each. The oscillation frequency generated by the second local oscillator 6 is controlled by the corrective circuit 7 such that the frequency of the second intermediate frequency signal is the same as the second intermediate reference frequency.

Since the calibration signal generator 9, the first oscillator 5, and the counter circuit 7 are operated on the basis of the oscillation frequency of the reference oscillator 2, the result counted by the counter circuit 7 mainly concerns the error of the second local oscillator 6.

Generally, the frequency error of the reference oscillator 2 is smaller than the frequency error of the second local oscillator 6 using an ordinary crystal oscillator. Therefore, the frequency error of the second local oscillator 6 can be corrected accurately on the basis of the reference signal f.

It is also possible to integrate the corrective circuit 7 and the frequency controlling circuit 3 into a single circuit. In this single integrated circuit, the respective correction factors are changed so as to output the control signals to the second local oscillator 6 and the reference oscillator 2, and a device for storing the operation results is provided therein.

The method of switching the signal received by the antenna 1 with the first intermediate frequency signal outputted by the calibration signal generator 9 to correct the oscillation frequency of the second local oscillator 6, includes a switching method which monitors a timer or a temperature sensor 4a in the main controller 4. Based upon predetermined outputs from the timer or temperature sensor 4a the switching method implemented by the main controller 4 for example stops the supply of power to the amplifier 10 and supplies power to the calibration signal generator 9 so that only the signal output by the calibration signal generator 9 is received by the first frequency converter 11 during calibration.

For example, when the timer is provided with the main controller 4, the main controller 4 issues the command for calibration at regular intervals. When the temperature sensor is provided, the main controller 4 issues the command for calibration when the temperature becomes higher than the predetermined temperature. It is also possible to provide both the timer and the temperature sensor. Further, it is also possible to provide a correction switch. In this case, the command for calibration is issued by the main controller 4 when the correction switch manually operated.

Further, in the case where the signal is received or transmitted from the calibration signal generator 9 when the command for the switching is being issued to the calibration signal generator 9, the change to the received signal is performed after the communication with the calibration signal generator 9 is completed. In such a case, the main controller 4 monitors whether or not communication is performed with the calibration signal generator 9, and therefore, changing to the received signal during the communication with the calibration signal generator 9 is prevented.

The operation will now be described in detail with the embodying example.

In the embodiment shown in FIG. 1, it is assumed that the receiving frequency is 1090 MHz, the oscillation frequency of the first local oscillator 5 is 1000 MHz, the first intermediate frequency is 90 MHz, the second intermediate frequency is 455 kHz, the frequency error of the reference oscillator 2 is 5 ppm frequency in stability, and the oscillation frequency of the second local oscillator 6 is 89.536 MHz due to being shifted by 9 Hz by about 100 ppm frequency in stability.

Under the above conditions, the operation wherein the oscillation frequency of the reference oscillator 2 is controlled on the basis of the signal received by the antenna 1, will be described.

The frequency of the received signal is assumed to be 1090 MHz, and the error is assumed to be 0. As the reference oscillator 2 has 5 ppm error, the oscillation frequency of the first local oscillator 5 is set to be not 1000 MHz but 1000.005 MHz actualfact. Accordingly, the output of the first frequency converter 11 is 89.995 MHz, which is determined by subtracting 1000.005 MHz from 1090 MHz. The output of the second frequency converter 12 is 459 kHz, which is determined by further subtracting 89.536 MHz from 89.995 MHz. The frequency of this second intermediate frequency signal, 459 kHz, is counted by the counter circuit 8, and then controlled in the frequency controlling circuit 3 such that the oscillation frequency outputted by the reference oscillator 2 is to be 455 kHz, which is the second intermediate frequency reference value. By this control, the oscillation frequency of the first local oscillator 5 becomes 1000.009 MHz, which is increased by 4 kHz. The error of the reference oscillator 2 is now 9 ppm, and hence, the frequency accuracy is deteriorated.

Only the above-described correction leads to the deterioration of the frequency accuracy caused by the error of the second local oscillator. The correction method in which the calibration signal is generated to improve the frequency accuracy, will next be described.

The explanation will be made with reference to the case where the calibration signal is generated under the conditions set fourth.

Upon receipt of the instruction from the main controller 4, the calibration signal generator 9 generates the first intermediate frequency signal having a frequency of 90 MHz, as the reference signal f, which is inputted into the second frequency converter 13 through the coupling capacitor C1 and the amplifier 12. Here, since the frequency error of the reference oscillator 2 is 5 ppm, the signal generated by the calibration signal generator 9 becomes 90.00045 MHz in actualfact. The output of the second frequency converter becomes 464.45 kHz, which is determined by subtracting 89.536 MHz which is the oscillation frequency of the second local oscillator, from the 90.00045 MHz. This output is counted by the counter circuit 8 so as to detect 9.45 kHz which is the difference from the second intermediate reference frequency 455 kHz. Based upon this counted value, 9.45 kHz, the frequency control signal is outputted by the corrective circuit 7 into the second local oscillator 6 to correct the oscillation signal so that the second intermediate frequency is set at 455 kHz. Accordingly, the oscillation frequency of the second local oscillator 6 is corrected by 9.45 kHz to become 89.54545 MHz. Consequently, the frequency error by the second local oscillator 6 is suppressed by about 5 ppm (0.45 kHz), which is one twentieth of the original frequency in stability of 100 ppm.

Then, the operation in the calibration signal generator 9 is stopped by the control from the main controller 4, the receiving section resets to the normal condition where the signal is received by the antenna 1.

Under this normal condition, the oscillation frequency of the first local oscillator 5 is set at 1000 MHz to receive the signal having a frequency of 1090 MHz, and then the correction is performed by the corrective circuit 7.

Since the oscillation frequency of the reference oscillator 2 has 5 ppm error, the oscillation frequency by the first local oscillator 5 is actually set to be 1000.005 MHz. Accordingly, the output of the first frequency converter is 89.995 Mhz, and the output of the second frequency converter is 449.55 kHz, which is determined by subtracting 89.54545 MHz which is the oscillation frequency by the second local oscillator 6, from the 89.995 MHz. The frequency 449.55 kHz of the intermediate frequency signal is counted by the counter circuit 8. Based upon the counted result, the oscillation frequency of the reference oscillator 2 is controlled to be 455 kHz, which is the second intermediate frequency reference value, in the frequency controlling circuit 3. Accordingly, the oscillation frequency by the first local oscillator 5 is set at 999,99955 MHz which is decrease by 5.45 kHz. As a result, the frequency error of the first local oscillator 5 can be improved by 0.45 kHz, namely, the frequency error of the reference oscillator 2 can be improved up to 0.45 ppm. Then, under the normal receiving operation, the oscillation frequency of the reference oscillator 2 is controlled by the frequency controlling circuit 3 such that the frequency of the second intermediate frequency signal is close to the newly set second intermediate frequency.

According to the first embodiment as described above, the frequency accuracy of the receiving section is greatly improved by correcting the frequency error of the second local oscillator 6.

Further, since the signal to be inputted into the counter circuit 8 is only the second intermediate frequency signal, and the frequency of the counter signal is low, the counter circuit 8 can easily be realized in CMOSLSI.

In the embodiment shown in FIG. 1, the calibration signal generated by the calibration signal generator 9 is inputted by means of the coupling capacitor C1. However, any other input device can be used as long as the calibration signal generator 9 is coupled in a high frequency range with the amplifier 12 and the second converter 13. For example, it is apparent that the floating capacitor, which is however not shown in the circuit, is applicable to the present invention.

In the first embodiment, as described above, the frequency accuracy is improved by controlling the oscillation frequency of the second local oscillator 6. It is, however, also possible to apply the present invention to a system having an other structure, which will be described in connection with the second embodiment.

Figure 2:
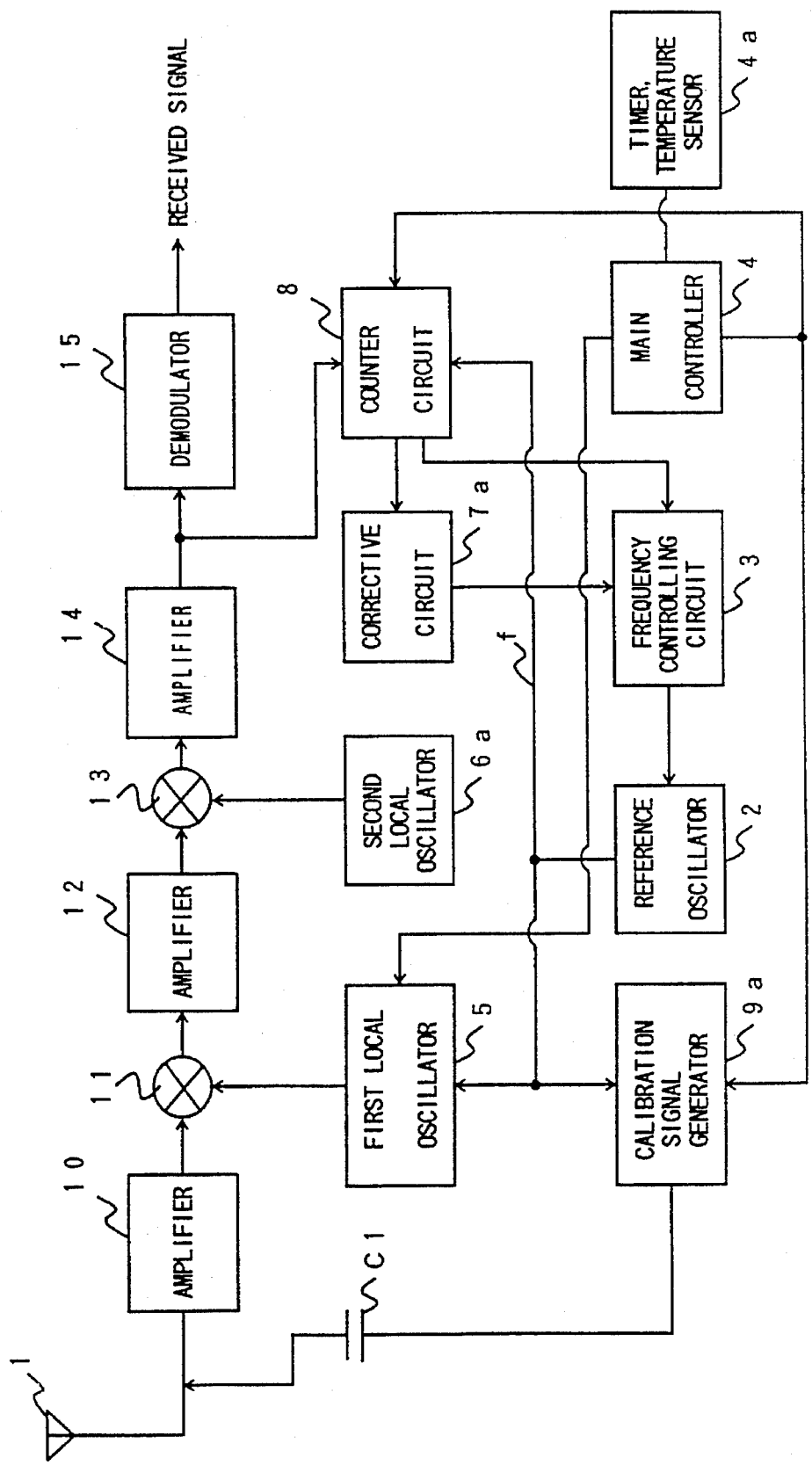
FIG. 2 is a block diagram showing the structure of a communication system according to the second embodiment of the present invention.

FIG. 2 shows the receiving section of a communication system according to the second embodiment. The circuits operated in the same manner as those of the first embodiment is indicated by the same reference numbers.

In FIG. 2, 6a indicates a second local oscillator, and 7a indicates a corrective circuit which outputs the counted value counted by the counter circuit 8, to the frequency controlling circuit 3 as a new second intermediate frequency reference value.

The differences between this second embodiment shown in FIG. 2 and the first embodiment shown in FIG. 1 are as follows: That is, (1) the second intermediate frequency reference value to be compared with the counted value in the frequency controlling circuit 3, is supplied from the corrective circuit 7a, (2) during the communication with the calibration signal generator 9, the corrective circuit 7a outputs the counted result by the counter circuit 8 into the frequency controlling circuit 3 as a new second intermediate frequency reference value, and (3) the frequency of the calibration signal generated by the calibration signal generator 9 is the same as that of the received signal, i.e., 1090 MHz.

The operation of the second embodiment will now be described.

The operation of correcting the oscillation frequency of the reference oscillator 2 by the received signal is the same as that which has been explained with reference to the first embodiment.

The operation of correcting the oscillation frequency error of the second local oscillator 6 will be described.

Upon receipt of the instruction from the main controller 4, a calibration signal generator 9a generates the signal having a frequency of 1090 MHz, which is the same frequency as the received signal, as a reference signal f. This signal is inputted into the first frequency converter 11 through the coupling capacitor C1 and the amplifier 10, in which the signal is mixed with the signal generated by the first local oscillator 5 to be converted into the first intermediate frequency signal. Similarly, the intermediate frequency signal is mixed with the signal generated by the second local oscillator 6a to be converted into the second intermediate frequency signal. The second intermediate frequency signal is counted in frequency in the counter circuit 8, and the counted value is outputted to the corrective circuit 7a, which outputs the counted value to the frequency controlling circuit 3 as a new second intermediate frequency reference value.

Then, under the normal operation, the oscillation frequency of the reference oscillator 2 is controlled by the frequency controlling circuit 3 such that the frequency of the second intermediate frequency signal is close to the new second intermediate reference frequency. The error of the second local oscillator 6a is contained in the new second intermediate reference frequency, so that the oscillation frequency of the reference oscillator 2 can be controlled with high accuracy similar to the first embodiment.

The operation will be explained in detail with an embodying example in connection with the second embodiment.

In the example explaining the operation of the second embodiment shown in FIG. 2, it is now assumed that the frequency of the received signal is 1090 MHz, the oscillation frequency of the first local oscillator 5 is 1000 MHz, the first intermediate frequency is 90 MHz, the second intermediate frequency is 455 kHz, the frequency error of the reference oscillator 2 is 5 ppm frequency in stability, the oscillation frequency of the second oscillator 6a is 89.5432 MHz due to being shifted by 1.8 KHz by about 20 ppm frequency in stability.

The operation in the case where the oscillation frequency of the reference oscillator 2 is corrected based upon the signal received by the antenna 1, will be described.

The frequency of the received signal is 1090 MHz and the oscillation frequency of the first local oscillator 5 is set at 1000 MHz. Here, as the oscillation frequency of the reference oscillator 2 has 5 ppm error, the oscillation frequency of the first local oscillator 5 is actually set to be 1000.005 MHz. Accordingly, the output of the first frequency converter 11 is 89.995 MHz, and the output of the second frequency converter 13 is therefore 1.8 kHz which is determined by subtracting 89.5432 MHz from the 89.995 MHz. The frequency of the second intermediate frequency signal, 1.8 kHz is counted in the counter circuit 8, and then controlled in the frequency controlling circuit 3 such that the oscillation frequency of the reference oscillator 2 is set at 455 kHz, which is the second intermediate frequency reference value. By this control, the oscillation frequency of the first local oscillator 5 becomes 1000.0018 MHz decreased by 3.2 kHz from the initial frequency 1000.005 MHz. As a result, the error of the reference oscillator can be decreased down to only 1.8 ppm.

As is apparent from the operation, the deterioration of the frequency accuracy caused by the error of the second local oscillator 6 cannot be prevented by this correction alone.

The operation in the case where the calibration signal generator of the present invention is applied, will next be described.

Upon receipt of the instruction from the main controller 4, the calibration signal generator 9a generates the signal having a frequency of 1090 MHz as the reference signal f. This signal is inputted into the first local converter 11 through the coupling capacitor C1 and the amplifier 10. Here, the frequency error of the reference oscillator 2' is 5 ppm, the frequency of the signal generated by the calibration signal generator 9a is in actual 1090.00545 MHz, and the oscillation frequency of the first local oscillator 5 is 1000.005 MHz. Accordingly, the output of the first frequency converter 11 is set at 90.00045 MHz, and then inputted into the second frequency converter 13 while maintaining the 5 ppm accuracy. The output of the second frequency converter 13 is accordingly set to be 457.25 kHz, determined by subtracting 89.5432 MHz from the 90.00045 MHz, which is then counted in the counter circuit 8. The counted result is outputted to the corrective circuit 7a. The corrective circuit 7a outputs the counted result to the frequency controlling circuit 3 as a new second intermediate frequency reference value, so as to update the initial second intermediate frequency reference value. Accordingly, the second intermediate reference value is set at 457.25 kHz. Then, the normal operational condition is reset where the signal is received by the antenna 1 when the operation is stopped by the control from the main controller 4.

Under this normal condition, the receiving frequency is 1090 MHz and the oscillation frequency of the first local oscillator 5 is set at 1000 MHz. As the oscillation frequency of the reference oscillator 2 has 5 ppm error, the oscillation frequency of the first local oscillator 5 is in actualfact set to be 1000.005 MHz. Accordingly, the output of the first frequency convert 11 is 89,995 MHz, and the output of the second frequency converter 13 is accordingly 451.8 kHz, which is determined by subtracting 89.5432 MHz from the 89.995 MHz. This frequency of the second intermediate frequency signal is counted in the counter circuit 8. Based upon the counted result, the oscillation frequency of the reference oscillator 2 is controlled to be 457.25 kHz, which is the updated second intermediate frequency reference value, in the frequency controlling circuit 3. Then, the oscillation frequency of the-first local oscillator 5 becomes 999.99955 MHz decreased by 5.45 kHz from the initial oscillation frequency of 1000.005 MHz. The frequency error of the first local oscillator 5 results in 0.45 kHz, that is, the frequency error of the reference oscillator 2 is improved up to 0.45 ppm.

As described in connection with the second embodiment, the frequency accuracy of the receiving section can be greatly improved since the frequency error of the second local oscillator 6a is measured and included in the second intermediate frequency reference value.

Further, the signal to be inputted into the counter circuit 7 is only the intermediate frequency signal and the frequency of the counter signal is low, which makes it possible to easily the counter circuit 8 in CMOSLSI. Furthermore, as one of the advantages of the second embodiment, it is not necessary to change the oscillation frequency of the second local oscillator 6a, and hence, the increase of the circuit in size can be prevented. Although the frequency of the signal generated by the calibration signal generator 9a is set to be the same as the receiving frequency in the second embodiment, the same effect can be obtained if it is set to the same as the first intermediate frequency as described in the first embodiment.

The present invention is applied to the receiving section in the first and second embodiments. However, it is apparent that the present invention is applicable to any communication system which has a receiving function.

As an example of such a communication system, the example in which the present invention is applied to a mobile telephone will be described with reference to FIG. 3

Figure 3:
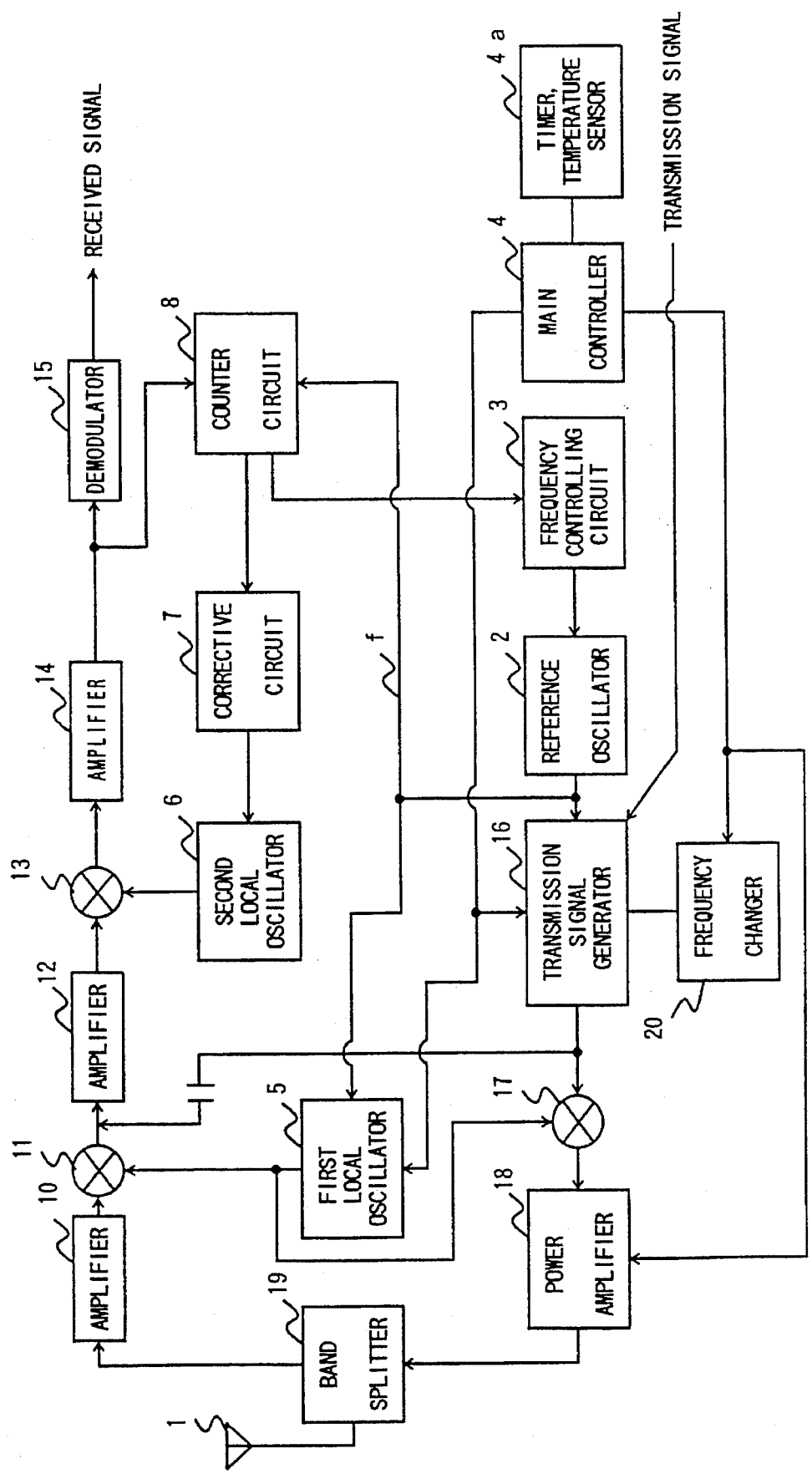
FIG. 3 is a block diagram showing the structure of a communication system according to the third embodiment of the present invention.

FIG. 3 shows the third embodiment of the present invention showing the structure of the mobile telephone system. The circuits operated similar to those shown in the first embodiment are quoted using the same reference numbers.

In FIG. 3, a transmission signal generator 16 generates a transmission signal based on the reference signal f and comprises a frequency synthesizer which generates the frequency-modulated carrier, modulation circuit, and the like. Numeral 17 shows a frequency converter, and numeral 18 shows a power amplifier which amplifies the transmission signal. A band splitter 19 splits the sending and receiving signals, and a frequency converter 20 causes the transmission signal generator 16 to generate the calibration signal and has a function of changing the frequency of the oscillation frequency of the transmission signal generator 16.

The difference between the third embodiment of the first embodiment shown in FIG. 1 lies in the method for generating the calibration signal. The controlling operation with respect to the oscillation frequencies of the reference oscillator 2 and the second local oscillator 6 are identical with the first embodiment.

The operation of the third embodiment will now be explained in detail.

In the example of the mobile telephone, as shown in FIG. 3, it is assumed that the receiving frequency is 1090 MHz, the sending frequency is 1180 MHz, the oscillation frequency of the first oscillator 5 is 1000 MHz, the first intermediate frequency is 90 MHz, the second intermediate frequency is 455 kHz, the oscillation frequency of the transmission signal generator 16 is 180 MHz, the frequency error of the reference oscillator 2 is 5 ppm frequency in stability, and the oscillation frequency of the second local oscillator 6 is 89.536 MHz, which is shifted by 9 KHz by about 100 ppm frequency in stability.

In the third embodiment, the description regarding the receiving operation is omitted as it is identical with that described with reference to the first and second embodiments.

In the transmitting operation, the transmission signal having a frequency of 180 MHz is initially outputted from the transmission signal generator 16 to the frequency converter 17 where the transmission signal is combined with the signal generated from the first local oscillator so as to generate the transmission signal having a frequency of 1180 MHz. This transmission signal is amplified by the power amplifier 18 and then transmitted by the antenna 1 through a band splitter 19. The received signal is transferred from the antenna 1 to the amplifier 10 through the band splitter 19.

The operation of generating the calibration signal will now be described.

Upon receipt of the instruction from the main controller 4, the frequency changer 20 changes the oscillation frequency of the transmission signal generator 16, i.e., 180 MHz, into 90 MHz. In this case, the operation of the power amplifier 18 is stopped so as not to transmit an unnecessary signal.

The signal generated by the transmission signal generator 16 is inputted into the second frequency converter 13 through the coupling capacitor C1 and the amplifier 12. Since the frequency error of the reference oscillator 2 is 5 ppm, the frequency of the signal generated by the transmission signal generator 16 is in actualfact 90.00045 MHz, and the output of the second frequency converter 13 is 464.45 kHz, which is determined by subtracting 89.536 MHz from the 90.00045 MHz. This output is counted by the counter circuit 8 so as to detect the difference 9.45 kHz with the second intermediate reference frequency 455 kHz. Based upon this counted value, the frequency control signal is outputted by the corrective circuit 7 to the second local oscillator 6 so as to correct the intermediate frequency to be 455 kHz. Accordingly, the oscillation frequency of the second local generator 6 is set at 89.54545 MHz, corrected by 9.45 kHz. Consequently, the frequency error of the second local oscillator 6 is suppressed to about 5 ppm (0.45 KHz) which is one twentieth of the original frequency in stability of 100 ppm. Then, after the main controller 4 controls the frequency changer 20 to reset the oscillation frequency of the transmission signal generator to the initial frequency, 180 MHz, the normal operational condition is reset where the signal is received by the antenna 1.

Under this normal condition, the receiving frequency is set at 1090 MHz by setting the oscillation frequency of the first local oscillator 5 to be 1000 MHz. As the oscillation frequency of the reference oscillator 2 has the 5 ppm error, the oscillation frequency of the first local oscillator 5 is actually set to be 1000.005 MHz. Accordingly, the output of the first frequency converter 11 is 89.995 MHz, and the output of the second frequency converter 13 becomes 449.55 kHz, which is determined by subtracting 89.54545 MHz from the 89.995 MHz. The frequency of the second intermediate frequency signal is counted in the counter circuit 8. Based upon the counted value, the oscillation frequency of the reference oscillator 2 is controlled in the frequency controlling circuit 3 to be 455 kHz which is the second intermediate frequency reference value. By this control, the oscillation frequency of the first local oscillator 5 becomes 999.99955 MHz which is decreased by 5.45 kHz from the 1000.005 MHz Consequently, the frequency error of the first local oscillator 5 is 0.45 kHz, namely, the frequency error of the reference oscillator 2 can be improved up to 0.45 ppm.

Figure 4:
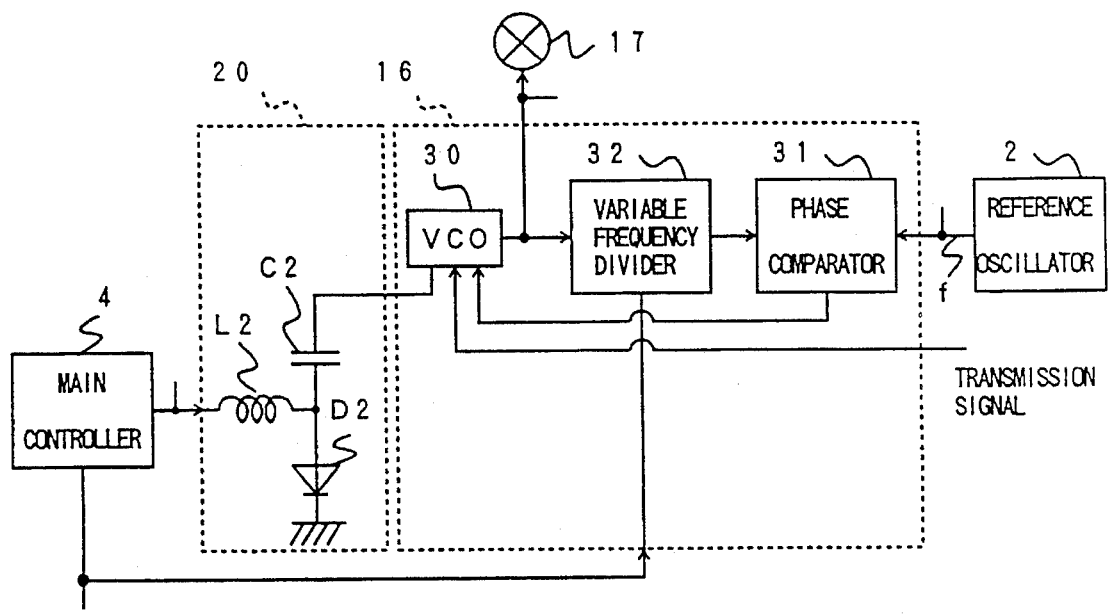
FIG. 4 is a block diagram showing an example of a calibration signal generator.

Further, the method of changing the range of the oscillation frequency of the transmission signal generator 16 by incorporating a capacitor into the VCO tuning circuit, with reference to detailed diagrams of the frequency changer 20 and the transmission signal generator 16 in FIG. 4

In FIG. 4, the frequency changer 20 comprises a capacitor C2, a coil L2, and a diode D2 which constitutes a diode switching circuit. The transmission signal generator 16 comprises a VCO 30 for outputting the oscillation frequency f1, a phase comparator 31 for comparing the output of the VCO 30 with the phase of the reference signal f so as to output the error signal, and a variable frequency divider 32 for dividing the frequency of the output from the VCO 30. The VCO 30, the phase comparator 31, and the variable frequency divider 32 constitute a PLL circuit. The reference oscillator 2 is adapted to oscillate the reference signal f and the main controller 4 is adapted to generate the instruction of changing the frequency.

When the frequency dividing ratio of the variable frequency divider 32 is assumed to n, the oscillation frequency f1 of the VCO 30 is represented by the following equation:

$f1 = nf$.

Accordingly, when the oscillation frequency of the transmission signal generator 16 is optimally set, the dividing ratio n of the variable frequency divider is instructed by the setting signal from the main controller 4.

For example, in this embodiment, when the oscillation frequency of the transmission signal generator 16 is changed from 180 MHz into 90 MHz, the instruction to halve the dividing ratio of the variable frequency divider 32 is issued from the main controller 4.

It is also possible to set the second intermediate frequency more freely by shifting the range of the oscillation frequency of the transmission signal generator 16. Here, the frequency changer 20 shown in FIG. 4 is used. In the frequency changer 20, the diode D2 is switched by the instruction from the main controller 4, so that the capacitor C2 and the VCO 30 are provided in parallel. In the practical circuit, the range of the oscillation frequency of the VCO 30 is limited, but a resonance frequency of the VCO 30 can be changed by the method described above.

The other method of changing the range of the oscillation frequency of the transmission signal generator 16 will now be described in association with FIG. 5.

Figure 5:
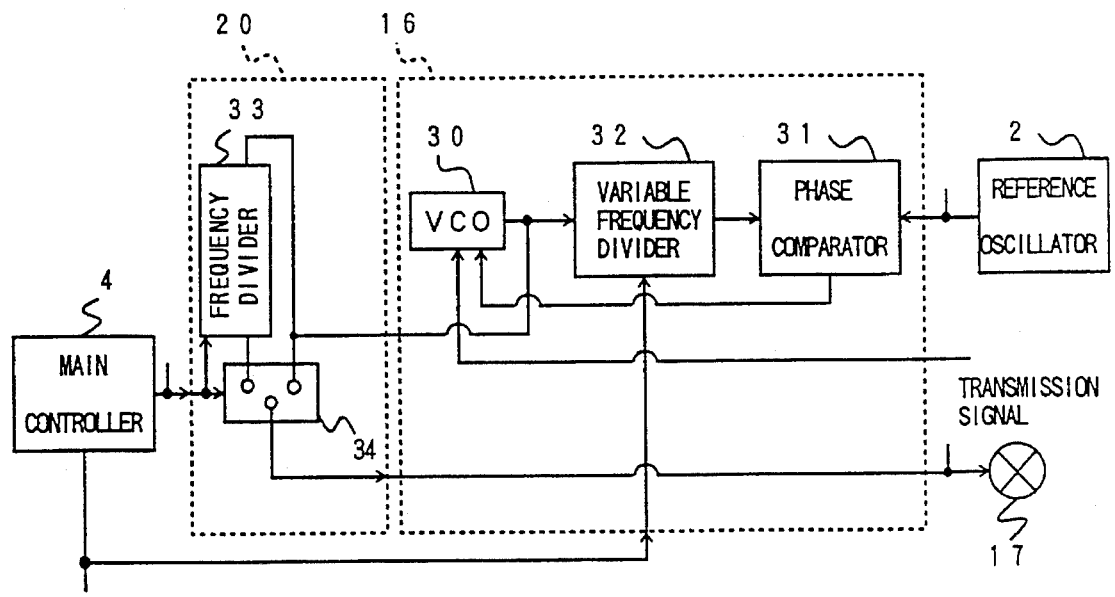
FIG. 5 is a block diagram showing another example of the calibration signal generator.

In FIG. 5, the frequency changer 20 comprises a frequency divider 33 and a switch 34 which changes the output directly from the VCO 30 with the output from the VCO 30 via the frequency divider. The VCO 30, the phase comparator 31, and the variable frequency divider 32 constitute a PLL circuit. The transmission signal to be outputted to the frequency converter 17 is outputted by the frequency changer 20.

The operation of the circuit shown in FIG. 5 will now be described.

In the third embodiment of the present invention, for example, when the oscillation frequency of the transmission signal generator 16 is changed from 180 MHz to 90 MHz, the output from the VCO 30 is divided in frequency so as to be half in the frequency divider 33 by changing the switch 34 upon instruction from the main controller 4.

According to the third embodiment of the present invention, the range of the oscillation frequency is changed with ease as described above.

As described with reference to the third embodiment, since the frequency error of the second local oscillator 6 is corrected when the present invention is applied to a mobile telephone system, the frequency accuracy of the reference oscillator 2 can be considerably improved.

Further, only the second intermediate frequency signal is inputted to the counter circuit 8, and the frequency of the counter signal is low, so that the counter circuit 8 is easily made in CMOSLSI. Furthermore, according to the third embodiment, the transmission signal generator 16 of the mobile telephone system is used as the calibration signal generator, the circuit can be minimized in size. As to the method for changing the oscillation frequency of the transmission signal generator 16, when the variable width of the VCO 30 included in the transmission signal generator 16 is broad, only the setting of the variable frequency divider 32 may be changed to generate the second intermediate frequency signal without using the frequency changer 20.

Also, in FIG. 3, as long as the transmission signal generator 16 is coupled with the amplifier 12 and the second frequency converter 13 in a high frequency range, it is not necessary to use the capacitor C1. In this case, for example, a floating capacitor not shown in the circuit may be used.

In particular, in a mobile communications system, a second oscillating device which generates a sending frequency signal based on the reference oscillator is provided in order to obtain the transmission signal. The circuit can be reduced in size by constituting the calibration signal generator using the second oscillating device. This is a great advantage for a portable communication system which is required for the minimization in size.

Figure 6:
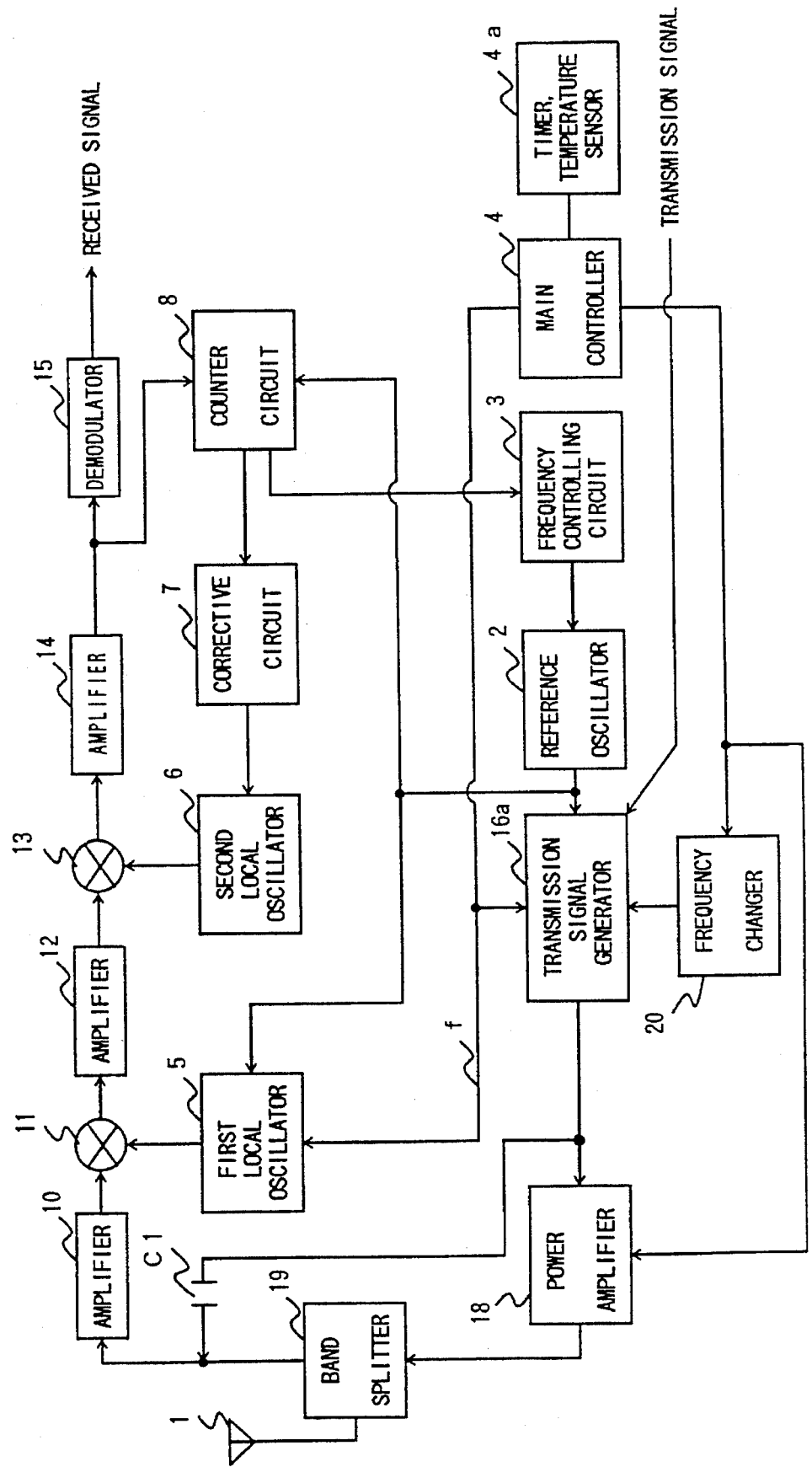
FIG. 6 is a block diagram showing the structure of a communication system according to the fourth embodiment of the present invention.

The transmission signal generator 16 generates the second intermediate frequency signal in the third embodiment, but it may generates the receiving frequency signal as the second embodiment, FIG. 6 shows the fourth embodiment of the present invention showing the structure of a mobile telephone system. The same reference numbers as the third embodiment are quoted to the circuits operated similar to those of the third embodiment. In FIG. 6, a transmission signal generator 16 comprises a frequency synthesizer for generating the frequency-modulated carrier, a modulation circuit, and the like. The difference in operation between the fourth embodiment of the third embodiment in FIG. 3 lies in the frequency of the output signal outputted from the transmission signal generator 16a. In the fourth embodiment, the transmission signal having a frequency of 1180 MHz, is directed outputted from the transmission signal generator. Similar to this, the frequency of the calibration signal is set to the receiving frequency.

The operation of the fourth embodiment will now be described with the embodying example.

In the fourth embodiment shown in FIG. 6, it is assumed that the receiving frequency is 1090 MHz, the sending frequency is 1180 MHz, the oscillation frequency of the first local oscillator 5 is 1000 MHz, the first intermediate frequency is 90 MHz, the second intermediate frequency is 455 kHz, the oscillation frequency of the transmission signal generator 16a is 1180 MHz, the frequency error of the reference oscillator 2 is 5 ppm by frequency stability, and the oscillation frequency of the second local oscillator 6 is 89.536 MHz shifting by 9 KHz by about 100 ppm frequency stability.

In this embodiment, the receiving operation is identical with the embodiments described before, so the explanation is omitted.

In the transmission operation, the transmission signal having a frequency of 1180 MHz is outputted from the transmission signal generator 16a. This signal is power-amplified with the power amplifier 18, and then outputted by the antenna 1 through the band splitter 19. The received signal is transferred to the amplifier 10 through the band splitter 19.

The operation of generating the calibration signal will next be described.

Upon receipt of the instruction from the main controller 4, the frequency changer 20 changes the oscillation frequency of the transmission signal generator 16a from 1180 MHz to 1090 MHz. Here, the operation of the power amplifier 18 is stopped so as not to transmit an unnecessary signal. The signal generated by the transmission signal generator 16a is inputted to the second frequency converter 13 through the coupling capacitor C1 and the amplifier 10. Since the frequency error of the reference oscillator 2 is 5 ppm, the frequency of the calibration signal of the transmission signal generator 16a is actually 1090.00545 MHz, and the oscillation frequency of the first local oscillator 5 is set to 1000.005 MHz. Accordingly, the output of the first frequency converter 11 is set to 90.00045 MHz, and the output of the second frequency converter 13 becomes 464.45 kHz which is determined by subtracting 89.536 MHz from the 90.00045 MHz. The frequency of this output is counted by the counter circuit 8 so as to detect the difference, 9.45 kHz, with the second intermediate reference frequency 455 kHz.

Based upon this counted value, the frequency control signal is outputted from the corrective circuit 7 to the second local oscillator 6 to correct the oscillation frequency to be 455 kHz. Accordingly, the oscillation frequency of the second local oscillator 6 is set to 545 MHz which is corrected by 9.45 kHz. As a result, the frequency error of the second local oscillator 6 is restrained to about 5 ppm (0.45 kHz), which is one twentieth of the original frequency in stability of 100 ppm. After that, the main controller 4 controls the frequency changer 20 to reset the oscillation frequency of the transmission signal generator 16a to the initial frequency, 1180 MHz. By this control, the normal condition is reset in which the signal is received by the antenna 1.

The receiving frequency becomes 1090 MHz by setting the oscillation frequency of the first local oscillator 5 to be 1000 MHz. Here, the oscillation frequency of the reference oscillator 2 has the 5 ppm error, the oscillation frequency of the first local oscillator 5 is actually set to be 1000.005 MHz. Accordingly, the output of the first frequency converter is 89.995 MHz, and the output of the second frequency converter becomes 449.55 kHz which is determined by subtracting 89.54545 MHz from the 1000.005 MHz. The frequency of the second intermediate frequency signal is counted by means of the counter circuit 8. Based on the counted value, the oscillation frequency of the reference oscillator 2 is controlled with the frequency controlling circuit 3 to become 445 kHz, which is the second intermediate frequency reference value. The oscillation frequency of the first local oscillator 5 is then become 999.99955 MHz decreased by 5.45 kHz from the 1000.005 MHz. Namely, the frequency error of the reference oscillator 2 is improved up to 0.45 ppm.

According to the present invention as described, the frequency accuracy of the reference oscillator can be greatly improved since the frequency error of the second local oscillator 6 is corrected in the mobile telephone system.

Further, only the second intermediate frequency signal is inputted to the counter circuit 8 and the frequency of the signal to be counted is low, the counter circuit 8 can be easily realized in CMOSLSI. Further, in the fourth embodiment, the transmission signal generator 16a of the mobile telephone system is used as the calibration signal generator as similar to the third embodiment, the increase of the circuit can be greatly reduced in size.

Furthermore, it is clear that the present invention can be applied to the case where the oscillation frequency of the first local oscillator 5 and the transmission signal generator 16a are set such that the difference therebetween corresponds to the first intermediate frequency. Namely, the oscillation frequency of the first local oscillator may be changed to generate the calibration signal, for example.

In FIG. 6, as long as the transmission signal generator 16a is coupled to the amplifier 10 and the first frequency converter 13 in a high frequency range, it is not necessary to use the coupling capacitor C1. A floating capacitor not shown in the circuit can be used, for example.

As described above, the first intermediate frequency signal and the receiving frequency signal can be generated by any means as the calibration signal based upon the reference signal generated by the reference oscillator or the like, whose frequency accuracy is higher than that of the second local oscillator.

During the reception of the calibration signal, any external signal has influence on the system when the acceptance of the external signal by the antenna 1 is rejected.

Since the frequency error of the second intermediate frequency can be corrected, the performance is stabilized in a communication system in which a narrowband signal is transferred. In such a case, it is not at all necessary to provide the reference oscillator with the frequency correction function and the frequency controlling circuit.

The description with respect to the fifth embodiment will now be made with reference to FIG. 7. A receiving section shown in FIG. 7 comprises the receiving section shown in FIG. 1 in duplex. The calibration signal outputted by the calibration signal generator 9 is sent either to the amplifier 12 or an amplifier 12a by changing a switch. Also, the signal to be inputted to the counter circuit 8 is sent from either the amplifier or an amplifier 14a by changing a switch. The respective switches are controlled by the main controller 4.

As shown in FIG. 7 in which the receiving sections are comprised in duplex, the switch is changed so as to transmit the calibration signal from the calibration signal generator 9 into either one of the receiving sections which is not in use for receiving the signal. The main controller 4 issues the instruction to generate the calibration signal, and at the same time, issues the instruction to change the switches for sending the calibration signal to the receiving section not in use during the the reception of the signal. Therefore, even if the communication is carried out with one receiving section, the calibration signal can be transmitted to the other receiving section which is not in use.

According to the embodiments as described above, the frequency error can be corrected without directly counting the frequency of the local oscillator, and therefore, the frequency accuracy of the reference oscillator can be greatly improved. Further, the frequencies to be transmitted are in the range of the second intermediate frequency, so that the circulization by CMOS process can be realized, which results in providing the communication system with low power consumption.

Figure 8:
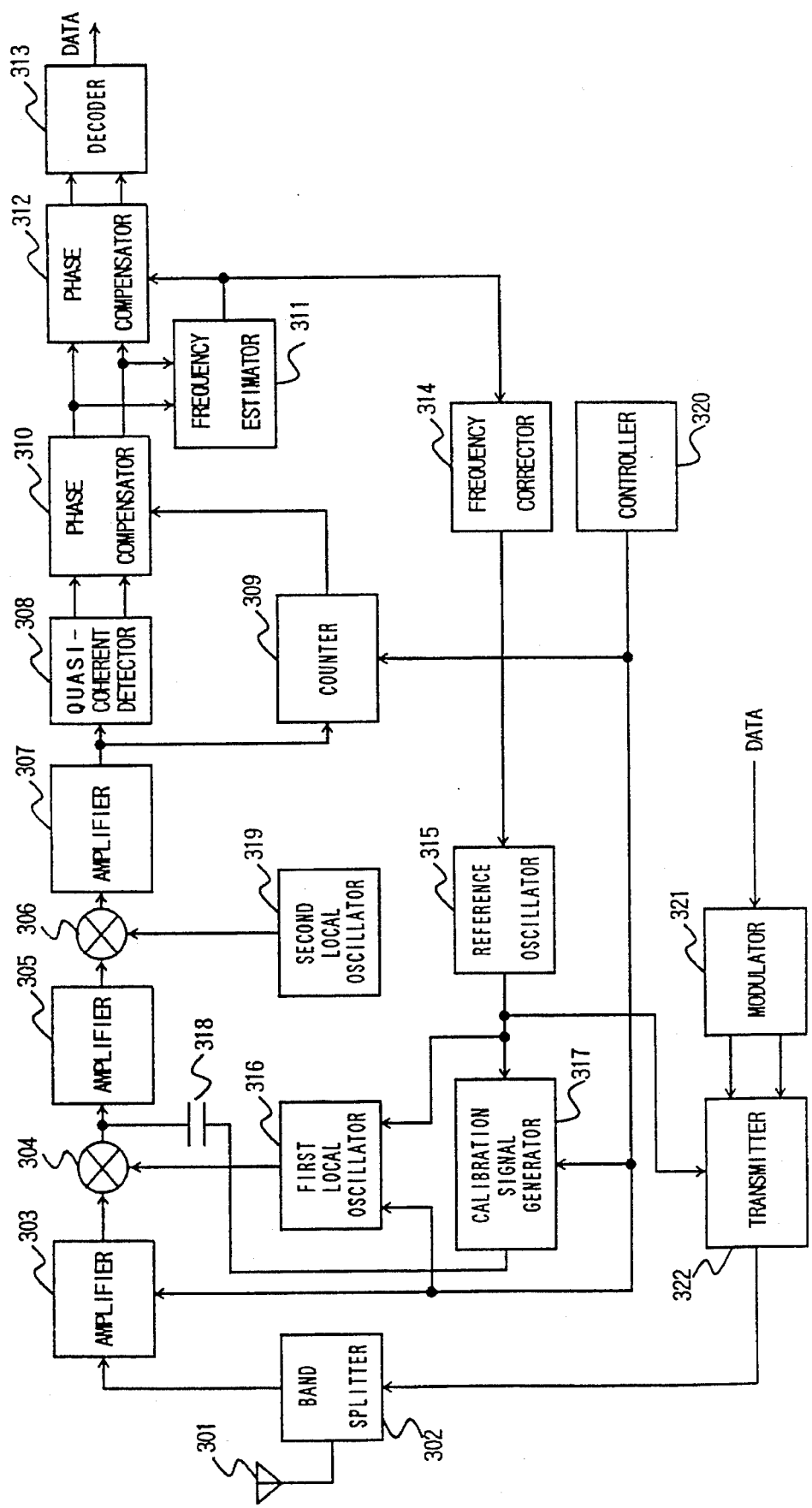
FIG. 8 is a block diagram showing the structure of a mobile communications system according to the sixth embodiment of the present invention.

FIG. 8 shows the sixth embodiment of the present invention showing the structure of a communication system.

The communication system shown in FIG. 8 includes, for example, a mobile communications system, in which the reference oscillator is controlled to follow the frequency of a base station in the communication with the base station. In FIG. 8, an antenna 301 transmits or receives signals, and a band splitter 302 splits the received signal from the transmission signal. Each of amplifiers, 303, 305, 307 amplifies the received signal. A first frequency converter 304 converts the output from the amplifier 303 into the first intermediate frequency signal, and a second frequency converter 306 converts the first intermediate frequency signal amplified by the amplifier 305 into the second intermediate frequency signal. A quasi-coherent detector 308 vector-demodulates the second intermediate frequency signal amplified by the amplifier 307 with a fixed reference carrier, which is set to the same frequency as the second intermediate frequency, to output a quasi-coherent demodulation signal. A counter 309 counts the frequency of the second intermediate frequency signal, and a first phase compensator 310 compares the counted value outputted by the counter 309 with a predetermined ideal second intermediate frequency reference value (hereinafter, referred to as a second frequency reference value) by means of a first frequency error estimator which is incorporated therein, to obtain the frequency error of the second intermediate frequency signal based upon the compared result, and stores the thus detected frequency error therein. Based upon this frequency error, the first phase compensator 310 compensates the phase of the received signal.

Figure 10:
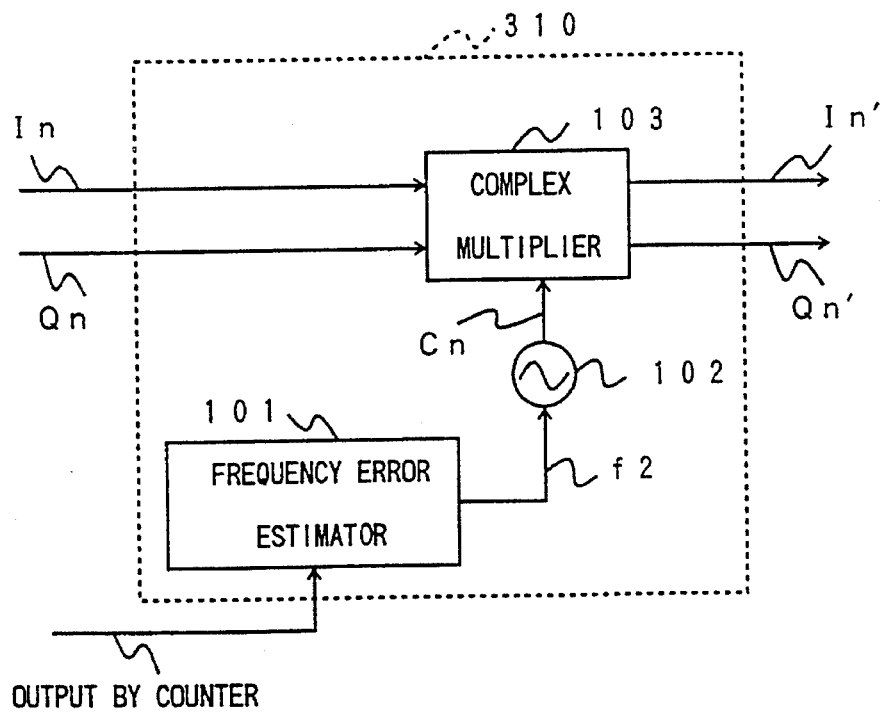
FIG. 10 is a block diagram showing the structure of a phase compensator 310.

The first frequency estimator includes the counter 309 and the frequency error estimator in the first phase compensator 310 which is shown in FIG. 10. A second frequency estimator 311 eliminates a modulation component from the output of the first phase compensator 310 to extract a phase rotation cause by the frequency error. The second frequency estimator 311 stores the phase rotation to obtain the average inclination (variation ratio) of time variation with respect to the detected value by performing a primary approximation to estimate this as the frequency error. A second phase compensator 312 compensates in phase with respect to the output of the first compensator 310 based upon the frequency error outputted from the frequency estimator 311. A decoder 313 converts the output of the phase compensator 312 into binary data, and a frequency corrector 31, which functions as the frequency corrective circuit in the embodiments shown in FIGS. 1 to 7, the oscillation frequency control signal corresponding to the frequency error outputted from the frequency estimator 311. A frequency estimating and correcting device comprises a frequency estimator in the counter 309, the first phase compensator 310, the second frequency estimator 311, and a frequency corrector 314. The oscillation frequency of a reference oscillator 315 is controlled by the frequency corrector 314, and the oscillation frequency of a first local oscillator 316 is determined based upon the reference oscillator 315. A calibration signal generator 317 generates a calibration signal having the same frequency as the first intermediate frequency based upon the reference oscillator 315, and a coupling capacitor 318 inputs the calibration signal into the amplifier 305. A calibration signal generating device may include the coupling capacitor 318 and the calibration signal generator 317. Further in the case where the frequency, which is the same as that of the received signal, is oscillated by the calibration signal generator 317, the calibration signal generating device may include the coupling capacitor 318, the calibration signal generator 317, and the first local oscillator 316, and the first frequency converter 304. Numeral 319 shows a second local oscillator, and 320 shows a controller which controls the operations of the amplifier 303, the counter 309, the first local oscillator 316, the calibration signal generator 317, and the like. A modulator 321 generates a complex baseband signal which is digital-modulated by the binary data. A transmitter 322 vector-demodulates the complex baseband signal to convert it into the transmission frequency.

Now, the operation will be explained.

The operation of estimating the frequency error in the second local oscillator 319 is initially described.

When the power in turned ON in a communication system, the controller 320 issues an instruction to the calibration signal generator 317 and the counter 309 to correct the frequency error of the second local estimator 319. The controller 320 may issue such an instruction with a regular period when the signal is being not received, or may have a temperature sensor so as to issue the instruction when the temperature reaches a predetermined temperature. Upon receipt of the instruction from the controller 320, the calibration signal generator 317 generates a first intermediate frequency signal as the calibration signal based on the oscillation frequency of the reference oscillator 315. This signal is inputted into the second frequency converter 306 via the coupling capacitor 318 and the amplifier 305. Here, the operations of the amplifier 303 and the first local oscillator 316 are stopped by the instruction from the controller 320 so as not to mix other unnecessary signal with the first intermediate frequency signal. The signal from the second local oscillator 319 is mixed with the first intermediate frequency signal in the second frequency converter 306 to convert the mixture into the second intermediate frequency, which is then to be counted by the counter 309.

The frequency error of the second local oscillator 319 is determined by the frequency difference between the counted value of the counter 309 and the second intermediate frequency reference value. For example, when the counted value is higher than the second intermediate frequency reference value, the second local oscillator is assumed to oscillate the frequency lower than the ideal oscillation frequency. This is because the frequency error of the second local oscillator 319 is directly transmitted to the second intermediate frequency signal since the difference component between the two inputted frequencies is mixed and extracted in the frequency converter 306. The estimate of this frequency error is performed within the first phase compensator 310. In the first phase compensator 310 where the second intermediate frequency reference value is stored, the counted value of the second intermediate frequency is compared with the reference value to determine the frequency error to be stored therein. The frequency error contained in the second intermediate frequency signal, that is, the frequency error of the second local oscillator is now defined as "frequency error A". On receiving the signal, the first phase compensator 310 eliminates the "frequency error A" from the second intermediate signal of the received signal, which is operated in the following manner.

As stated above, when the instruction is sent from the controller 320, the calibration signal is generated by the calibration signal generator 317, and converted into the second intermediate frequency signal in the second frequency converter 306. The frequency of the second intermediate frequency signal is counted by the counter 309. The thus counted value is inputted from the counter 309 into the first phase compensator 310, where the frequency error is estimated from the second intermediate frequency reference value, and the frequency error is stored therein. The frequency error includes both the frequency error of the second local oscillator 319 and the frequency error of the calibration signal oscillator 317, or the reference oscillator 315. However, the reference oscillator 315 is higher than the second local oscillator 316 in frequency accuracy, and hence, the frequency error of the second intermediate frequency signal mainly concerns the frequency error of the second local oscillator 319.

The operation of controlling the oscillation frequency of the reference oscillator 315 on the basis of the received signal will be described. The signal, which is received by the sending/receiving antenna 1 and separated by the band splitter 302, is inputted into the first frequency converter 304 through the amplifier 303. In the frequency converter 304, the output signal of the second local oscillator 316 which is determined on the basis of the reference oscillator 315, is mixed with the received signal to convert the mixture into the first intermediate frequency signal. Then, the first intermediate frequency signal is converted into the second intermediate frequency signal via the amplifier 305, the second frequency converter 306, and the amplifier 307, and then is inputted into the quasi-coherent detector 308. In the quasi-coherent detector 308, the second intermediate frequency is vector-demodulated by using the fixed reference carrier which is set to the second intermediate frequency to obtain a complex baseband signal. Accordingly, the quasi-coherent modulation signal includes phase rotation owing to the frequency error in which the frequency errors of the first local oscillator 316 and the second local oscillator 319 are added together.

This quasi-coherent modulation signal is inputted into the first phase compensator 310. Based upon the estimated value of the "frequency error A" caused by the second local oscillator 319, the equivalent phase compensation is performed. As a result of this, the frequency error to be estimated by the second frequency estimator 311 corresponds to the frequency error caused by the reference oscillator 315. Now, the frequency error caused by the reference oscillator 315 is defined as "frequency error C". That is, when the frequency error, which is occurred when the frequency is estimated without compensating any influence of the frequency error of the second local oscillator with respect to the received signal, is defined as "frequency error B" (i.e., the "frequency error B" includes both the frequency error caused by the second local oscillator 319 and the frequency error caused by the reference oscillator 315), the "frequency C" is determined by subtracting the "frequency error A" from the "frequency error B". The frequency estimator 311 eliminates modulation component with respect to the output from the phase compensator 310 to estimate the "frequency error C" from the remaining phase rotation, thereby outputting the frequency error signal. The frequency error signal generated by the second frequency estimator 311 is inputted into the frequency corrector 314 and the second phase compensator 312. The oscillation frequency control signal is outputted from the frequency corrector 314 so that the oscillation frequency of the reference oscillator 315 is controlled in such a direction that the frequency error signal of the frequency estimator 311 is minimized. The error component of the second local oscillator 319 is controlled in the above mentioned manner, the oscillation frequency control signal outputted by the second frequency estimator 311 is mostly effected by the frequency error of the first local oscillator 316 determined by the reference oscillator 315. The correction of the reference oscillator 315 by the frequency corrector 314 on the basis of the oscillation frequency control signal, enables the reference oscillator 315 to follow the frequency transmitted from the base station with high accuracy.

Further, the output from the first phase compensator 310 is also inputted into the second phase compensator 312, to perform the phase compensation corresponding to the frequency error estimated by the frequency estimator 311, thereby establishing the synchronization. This synchronized demodulation signal is outputted into the decoder 313 to be converted into the binary data.

As to sending the signal, the sending frequency is set on the basis of the reference oscillator 315, so that it follows to the frequency of the base station by controlling the oscillation frequency of the frequency corrector 314.

The characteristic portion of the communication system according to the present invention will now be described in detail.

Figure 9:
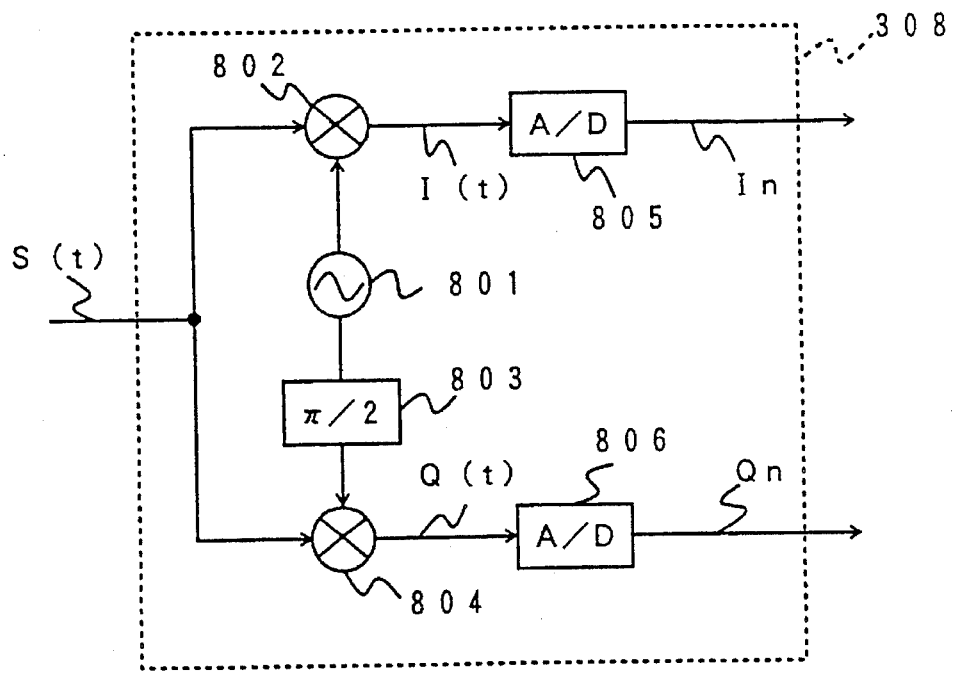
FIG. 9 is a block diagram showing the structure of a quasi-coherent detector 308.

FIG. 9 shows the architecture of the quasi-coherent detector 308. In FIG. 9, numeral 801 indicates a fixed reference frequency-modulated carrier oscillator, and numerals 802 and 804 indicate frequency mixers for performing the detection using an in-phase signal and a quadrature phase signal of the oscillation frequency of the fixed reference carrier oscillator 801 which is set to the second intermediate frequency. A π/2 phase shifter 803 generates the quadrature phase signal, and A/D converters 805,806 sample the detection outputs. S(t) is the second intermediate frequency signal, and I(t) and Q(t) are in-phase signal and quadrature phase signal of the vector-detected complex baseband signal, respectively, and In and Qn are sampled digital signals. The complex baseband signals I(t) and Q(t) are expressed by the following equation:

$$I(t)+jQ(t)=(I+jQ)\, e^{j2\pi f_e t}. \tag{1}$$

wherein the signals without frequency error are I and Q, and the frequency error is fe. Further, when the sampling period of the A/D converter is Ts, the following equation is obtained.

$$In=I(nTs) \quad Qn=Q(nTs) \tag{2}$$

Therefore, the quasi-coherent demodulation signal can be expressed as $$In+jQn=(I+jQ)\, e^{j2\pi f_e nTs}, \tag{3}$$

The first phase compensation is performed with respect to this quasi-coherent demodulation signal in the phase compensator 310, which will now be explained in detail.

FIG. 10 shows the structure of the phase compensator 310. In FIG. 10, the second intermediate frequency reference value is stored in a memory of the frequency error estimator 101. The frequency error estimator 101 compares the second intermediate frequency reference value with the counted value of the frequency of the second intermediate frequency signal counted by the counter 309, to estimate the "frequency error A" to be stored therein and outputted. Numerals 102 and 103 indicate a digital oscillator and a complex multiplier, respectively. The estimated output frequency of the frequency error estimator 101 is referred to as f2, a phase compensation signal outputted by the digital oscillator 102 is as Cn, and the compensated quasi-coherent demodulation signals are as In' and Qn'.

The counted value counted by the counter 309 is inputted into the frequency error estimator 101, in which the counted value is compared with the second frequency reference value to obtain the difference therebetween. The "frequency error A" of the second local oscillator 319 is detected based upon the difference, and is stored to be outputted. The estimated value t2 of the estimated "frequency error A" is inputted into the digital oscillator 102, which outputs the phase compensation signal Cn shown in the following equation:

$$Cn=\cos(2\pi f2 nTs)-j\sin(2\pi f2 nTs)=e^{-j2\pi f2 nTs} \tag{4}$$

In the complex multiplier 103, the phase compensation signal Cn is complex multiplexed with In and Qn respectively, which results in the following equation as the output of the phase compensator 310, $$In'+jQn'=(I+jQ)\, e^{j2\pi(f_e-f2)nTs} \tag{5}$$

The quasi-coherent signals In' and Qn' are inputted into the frequency estimator 311, in which the remaining frequency error C =(fe-f2) is estimated and outputted. The estimating method is disclosed, for example, in "Block Demodulation for Short Radio Packet" of Electronic Communication Academic Journal vol. J67/B No. 1, 1984, pp 54–61 by Junji Namiki, in which the quasi-coherent demodulation signal of the multiplier is converted into angle information, which is then estimated by the calculating method. For example, with respect to a PSK signal in M phase, M times the PSK signal eliminates the modulation component therefrom. Then, the phase rotation is extracted at each modulation symbol, and the primary approximation is performed with respect to the time variation of the stored value of this phase rotation to obtain the inclination of the approximate line, by which the frequency error is calculated. However, to obtain the frequency error accurately, it is necessary to settle the phase rotation at a single symbol section, which is the inverse of the modulation velocity, within 2π/M [rad]. In this embodiment, the absolute frequency error to be inputted into the second frequency estimator 311 can be reduced by providing the first phase compensator before the second frequency estimator 311, and hence, the likelihood that the phase rotation exceeds the 2π/M [rad] which causes an error in estimating the frequency, can be reduced.

Figure 11:
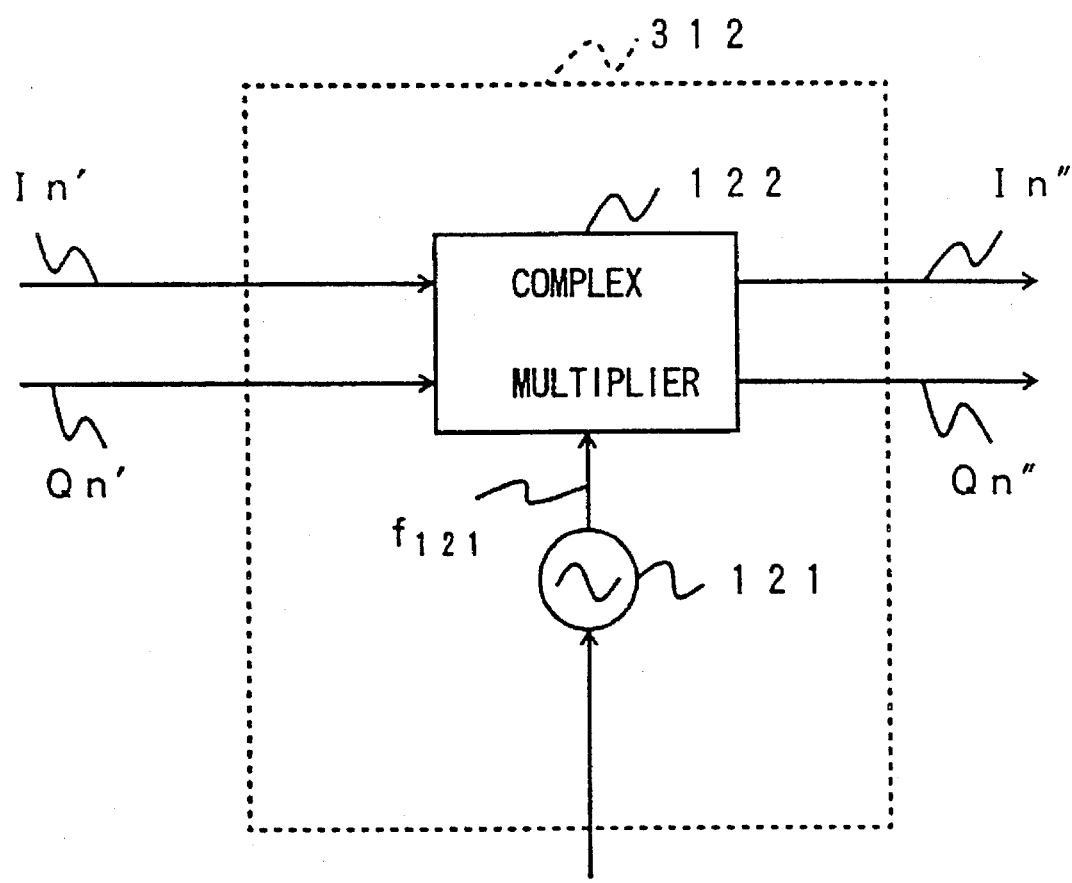
FIG. 11 is a block diagram showing the structure of a phase compensator 312.

FIG. 11 shows the structure of the second phase compensator 312, which comprises a digital oscillator 121, and a complex multiplier 122. The digital oscillator 121 generates the estimated output frequency f121 by using the given frequency error C=(fe−f2), which is shown below:

$$f121 = e^{-j2\pi(fe-f2)nTs}. \quad (6)$$

The phase rotation is eliminated with the complex multiplier 122, to output to the decoder 313, In"+jQn", as the coherent demodulation signal of the I+jQ including no frequency error.

Upon receipt of the frequency error signal (frequency error C) from the second frequency error estimator 311, the frequency corrector 314 outputs the oscillation frequency control signal so that the oscillation frequency of the reference oscillator 315 is controlled in the direction of minimizing the frequency error signal of the frequency estimator 311.

The oscillation frequency control signal is determined by the following operational procedure.

If [frequency error C]>[θ], the oscillation frequency control signal is controlled such that the oscillation frequency of the reference oscillator 315 is increased. By this operation, the reference oscillator 315 is controlled so as to increase the frequency of the first local oscillator, which makes the difference from the frequency of the received signal smaller. As a result, the frequency of the second intermediate frequency signal is decreased, and the counted value is therefore reduced.

On the contrary, if [frequency error C]<[θ], the oscillation frequency control signal is controlled by the frequency corrector 314 such that the oscillation frequency of the reference oscillator 315 is decreased. By this operation, the frequency of the first local oscillator is decreased, which makes the difference from the frequency of the received signal larger.

In this embodiment, the controlling degree for the oscillation frequency control signal is changed by the correction factor according to the frequency difference. For example, if the frequency difference is large, the controlling width is set to be large, which speeds up the operation.

In the above mentioned manner, the oscillation frequency of the reference oscillator 315 is controlled such that the frequency of the second intermediate frequency signal is close to the second intermediate reference frequency.

The details of the operation will be described with the accompanying embodiments.

In the embodiment shown in FIG. 8, it is now assumed that the receiving frequency is 1090 MHz, the oscillation frequency of the first local oscillator 316 is 1000 MHz, the first intermediate frequency is 90 MHz, the second intermediate frequency is 455 kHz, the frequency error of the reference oscillator 315 is 3 ppm and the frequency error of the second local oscillator is about 100 ppm, and the oscillation frequency of the second local oscillator is 89.536 MHz due to being shifted by 9 kHz.

The frequency of the first local oscillator 316 is set at 1000 MHz. Since the frequency error of the reference oscillator 315 is 3 ppm, the oscillation frequency of the first local frequency 316 includes this error, thereby outputting 1000.003 MHz in actual fact, for example. Accordingly, the signal having a frequency of 1090 MHz, which is received by the sending/receiving antenna 1, is converted to 89.997 MHz which is determined by subtracting 1000.003 MHz from 1090 MHz in the first frequency converter 302, and is then converted to 461 kHz determined by subtracting 89.536 MHz from the 89.997 MHz in the second frequency converter 306, which is then outputted as a second intermediate frequency signal.

Assuming that, as in the prior technique where the phase compensator is integrated into a single device, the second intermediate frequency error is estimated only with the frequency estimator 311. The second intermediate frequency signal includes both the frequency errors of the first and second local oscillators, and hence, the difference from the 455 kHz is 6 kHz. In this case, the frequency error is determined as −6 ppm with respect to the 1000 MHz, so that the reference oscillator 315 is controlled to be 9 ppm (3 plus 6), resulting in deteriorating the frequency accuracy.

However, in the embodiment of the present invention, as shown in FIG. 8, the frequency errors of the second local oscillator 319 and the reference oscillator 315 are obtained in advance by using the calibration signal, and accordingly, the frequency error of the second local oscillator 319 is eliminated from the received signal converted into the second intermediate frequency signal by the phase compensator 310. Further, the error of the reference oscillator 315 is estimated by the frequency estimator 311, and then the estimated error of the reference oscillator 315 is eliminated by the phase compensator 312. Then, the reference oscillator 315 is controlled with high accuracy by the frequency corrector 314.

Namely, the calibration signal generator 317 generates the first intermediate frequency 90 MHz, based on the reference oscillator 315. Since the frequency stability of the reference oscillator 315 is 3 ppm, the calibration signal becomes 90.0003 MHz. In the second frequency converter 306, 90.0003 MHz is subtracted by 89.536 MHz so as to output 464.3 kHz as a second intermediate frequency signal. This second intermediate frequency signal is counted by the counter 309 and then the difference, 8.7 kHz, from the 455 kHz is estimated in the frequency error estimator 101 provided within the first phase compensator 310.

The second intermediate frequency signal of the received signal having a frequency of 461 kHz, is corrected with the estimated value of the 8.7 kHz by the first frequency corrector 310, so that the frequency signal having a frequency of 452.3 kHz (461 minus 8.7) is inputted to the frequency estimator 311. The frequency estimator 311 estimates −2.7 kHz (452.3 minus 455), which is determined as +2.7 ppm with respect to 1000 MHz, thereby the reference oscillator 315 is controlled to be 0.3 ppm (3 minus 2.7). As a result, the frequency accuracy of the reference oscillator 315 is assumed to be 3 ppm absolute accuracy, the accuracy of following to the base station can be controlled to be 0.3 ppm, and the frequency error is suppressed to be one tenth.

Figure 22:
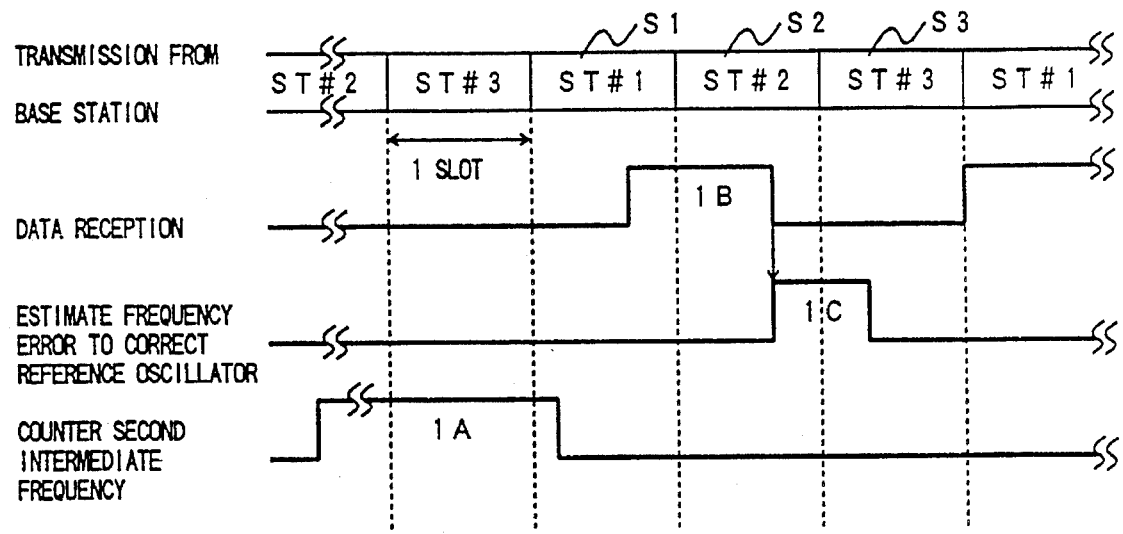
FIG. 22 is a timing chart of an automatic frequency control processing according to the tenth embodiment.
Figure 23:
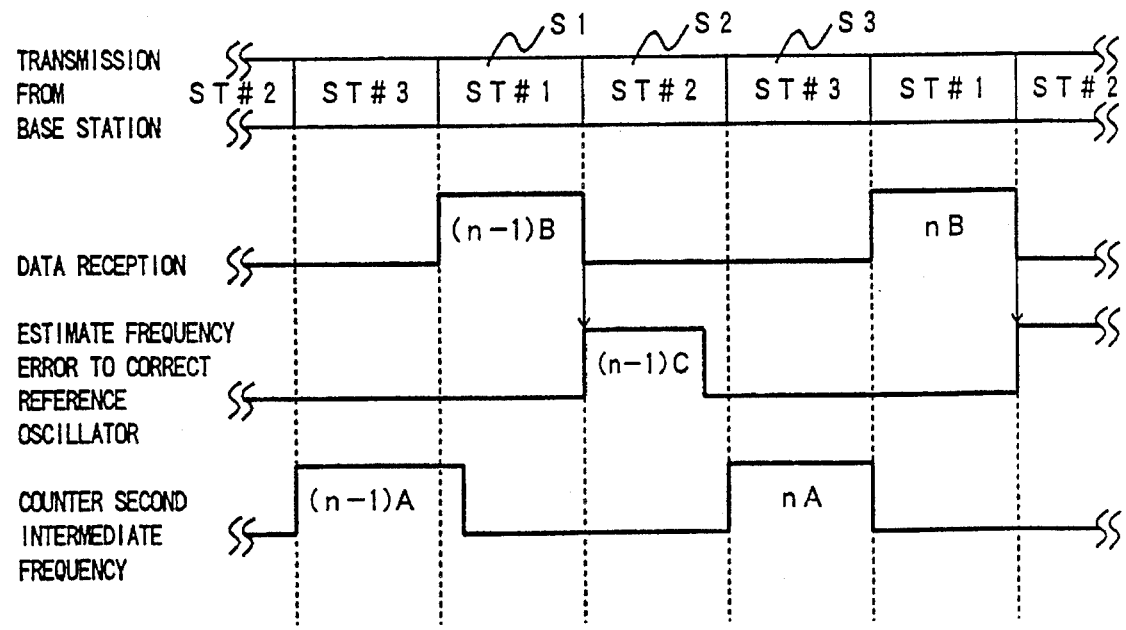
FIG. 23 is a timing chart of an automatic frequency control processing according to the tenth embodiment.

The timing of the operations are explained with reference to timing chats shown in FIGS. 22 and 23. FIG. 22 shows the initial operation of controlling the frequency, and FIG. 23 shows the operation in the stand-by mode. In FIGS. 22 and 23, S1, S2, and S3 are allocated slots in time division communication, and the signal of the S1 channel is to be received in these three frequency channels.

In FIG. 22, when the power is turned ON in the mobile communications system, the calibration signal generator 317 is operated by the controller 320 to obtain the error of the second local oscillator 319. During the section indicated as 1A, the frequency of the second intermediate frequency signal is counted by the counter 309 and the frequency error of the second local oscillator 319 is estimated by the phase compensator 310 to be is stored. Next, during the time period of one slot (section 1B), the sending data is received and stored. During the section 1C, the error component caused by the reference oscillator 315 is estimated from the thus stored sending data by the frequency estimator 311. Based on the "frequency error C", the frequency corrector 314 corrects the reference oscillator 315. The section 1A should be set to the time sufficient for obtaining the necessary frequency accuracy before the start of receiving data. For example, in the above example, it is assumed that the first intermediate frequency signal is 90 MHz, and the frequency error of the reference oscillator 315 is 3 ppm, the counting may be performed with +270 Hz accuracy, so that the counting time is set to be longer than 37 ms (1/270). The operation to be done in the section 1C is processed sufficiently by the time the next time slot of the S1 channel turns around. Further, the base station may transmit the transmission signal to correct the reference oscillator 315, in addition to usual data.

The example of the mobile communications system in the stand-by mode after establishing the synchronization in slot with the base station, will be described with reference to FIG. 23. In FIG. 23, the mobile communications system is synchronized with the slot ST#1 (S1). In the mobile communications system, the data of the allocated slot ST#1 shown in the sections (n-1)B and nB, is received, and call or the like from the base station is monitored. In this event, when the frequency error of the second local oscillator is to be reestimated, the calibration signal is generated by using the empty slot period. Then, similar to the manner above described, the second frequency signal is counted by the counter 309 and the frequency error of the second local oscillator 319 is estimated by the phase compensator 310. In FIG. 23, there is shown the example in which the counting is performed in the period of slot ST#3 (S3) shown in the sections (n-1)A and nA. When the time for one slot is not sufficient for counting, the frequency error may be estimated by using the value detected by a plurality of the stored counted values. In such a case, the reference oscillator 315, which follows the base staion, is improved in the frequency accuracy, the error of the second local oscillator 319 can be estimated with high accuracy.

In the sixth embodiment, the frequency error of the second local frequency oscillator 319 is counted beforehand by using the calibration signal. In communication with the base station, the frequency error caused by the second local oscillator 319 is suppressed by the phase compensator 310, and then, the frequency is estimated by the operation in the frequency estimator 311. Accordingly, high-speed automatic frequency control can be achieved with high accuracy. Further, the counter 309 is adapted to count only the second intermediate frequency, and the frequency to be counted is low, which enabling the counter 309 to be made to CMOS-LSI easily.

In addition, since the phase compensator is provided before the frequency estimator 311, the absolute amount of the frequency error to be inputted into the frequency estimator 311 can be reduced. Accordingly, when the difference between the first local oscillator 316 and the second local oscillator 319 is large, the likelihood that the phase rotation in a single symbol section caused by the frequency error in the output of the quasi-coherent demodulation signal, exceeds the threshold value for discriminating the phase modulation component, for example, $\pi/2$ [rad] of QPSK, which leads to misestimate of the frequency, can be reduced.

With regard to this, the frequency of the second local oscillator is estimated by using the counter 309, there is no influence to estimate the frequency even if the absolute the modulated frequency error is large.

Figure 12:
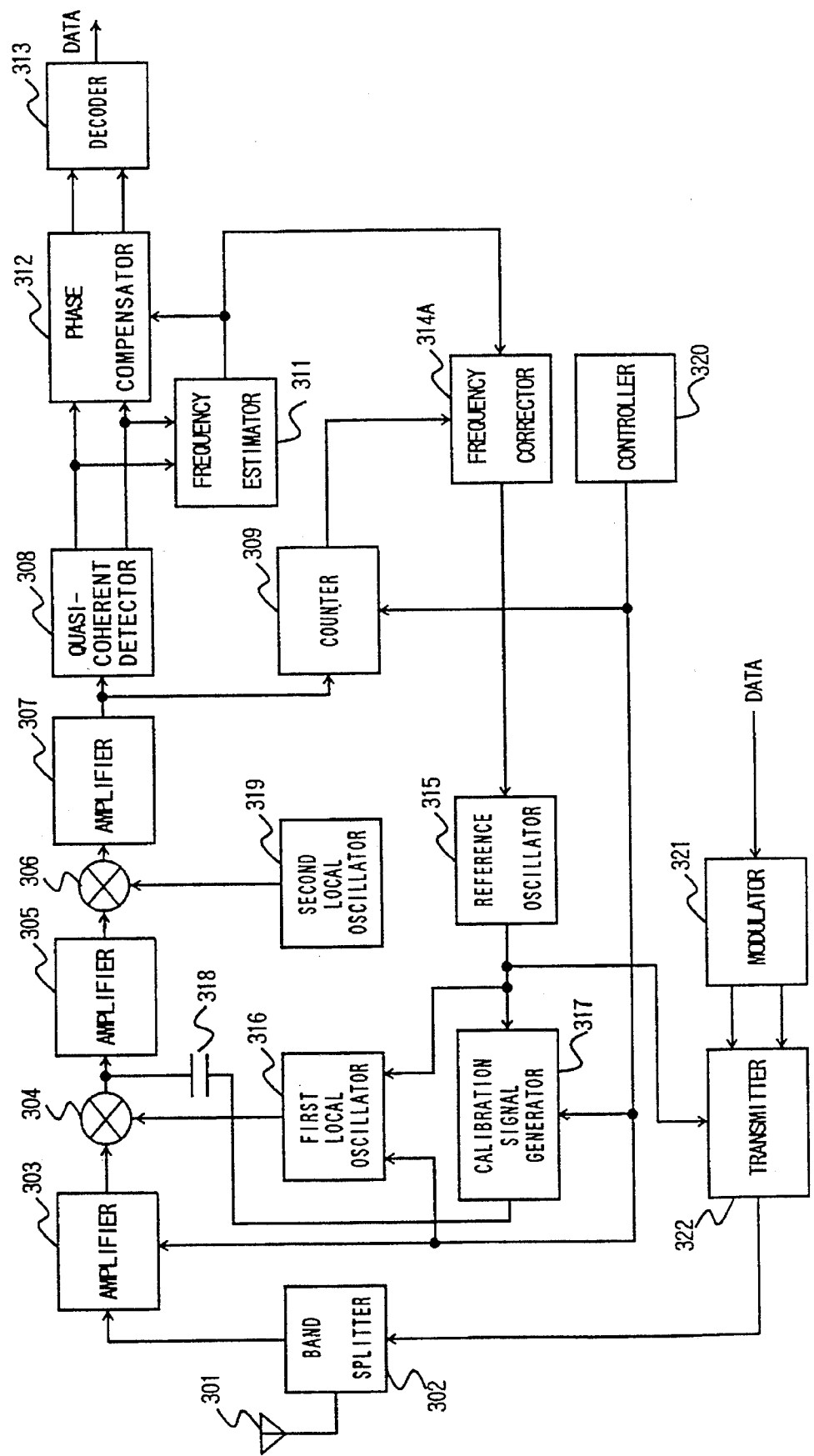
FIG. 12 is a block diagram showing the structure of a mobile communications system according to the seventh embodiment.

The seventh embodiment of the present invention will now be described with reference to FIG. 12 in which the structure of the mobile communications system is shown. The same reference numbers are quoted to the same circuits as those of the FIG. 8. In FIG. 12, a frequency corrector 314A is adapted to control the reference oscillator 315 with the estimated result of the frequency estimator 311, which corresponds to the frequency error A caused by the second local oscillator estimated by the value counted by the counter 309.

The difference between the seventh embodiment and the first embodiment described above is as follows: That is, (1) the phase compensator 310 is eliminated, and the quasi-coherent demodulation signal from the quasi-coherent detector 308 is directly inputted into the frequency estimator 311 and the phase compensator 312; and (2) the counted value is outputted from the counter 209 to frequency corrector 314A, and a frequency controller 314A controls the reference oscillator 315 by the estimated result of the frequency estimator 311 which corresponds to the frequency error A caused by the second local oscillator estimated by the value counted by the counter 309. That is, in the seventh embodiment, the frequency error A caused by the second local oscillator 319 is estimated in advance using the calibration signal. In the normal condition where the signal is received, correction value is calibrated by using the frequency error A when the frequency is corrected with respect to the reference oscillator 315 on receiving the signal. In this case, the frequency estimating and correcting device may include the counter 309 functioning as the first frequency estimator, the frequency estimator 311 functioning as the second frequency, and the frequency corrector 314A.

The operation of this embodiment is explained by way of example in detail. It is assumed that the receiving frequency is 1090 MHz, the oscillation frequency of the first local oscillator 316 is 1000 MHz, the first intermediate frequency is 90 MHz, the second intermediate frequency is 455 kHz, the frequency error of the reference oscillator 315 is 3 ppm, and the accuracy of the second local oscillator 319 is about 10 ppm and the oscillation frequency thereof is 89.546 MHz shifting by 1 kHz.

As the frequency stability of the reference oscillator 315 is 3 ppm, the calibration signal is 90.0003 MHz, which is converted with the second frequency converter 306 into the second intermediate frequency having a frequency of 454.3 kHz, as the second intermediate frequency signal. This second intermediate frequency signal is counted by the counter 309. Then, the frequency corrector 314A obtains the correcting value, +0.7 ppm, with respect to 1000 MHz is obtained from the −7 kHz which is the difference between the 455 kHz and the 454.3 kHz, and stores it therein.

In communication with the base station, the signal having the receiving frequency of 1090 MHz is subtracted by 1000.003 MHz to be converted into 89.997 MHz in the first frequency converter. In the second frequency converter 306, 89.546 MHz is subtracted from the 89.997 MHz to obtain 341 kHz as the second intermediate frequency signal. This second intermediate frequency signal is directly inputted into the frequency estimator 311, and the difference from the reference value 344 kHz, i.e., −4 kH is estimated and outputted into the frequency corrector 314A and the phase compensator 312. The frequency corrector 314A estimates that the error is +4 ppm based on the estimated value of −4 kHz. Further, by using the correction value +0.7 ppm determined beforehand for subtracting the error of the second local oscillator 319, the frequency error of the reference oscillator 315 is obtained as 3.3 ppm (4 minus 0.7). As a result, the reference oscillator 315 is controlled by the frequency corrector 314 A to be −0.3 ppm (3 minus 3.3).

In the seventh embodiment, the complex multiplier processing for compensating the phase can be completed at only one time by eliminating the phase compensator 310, thereby realizing the lower power consumption comparing with the sixth embodiment.

Figure 13:
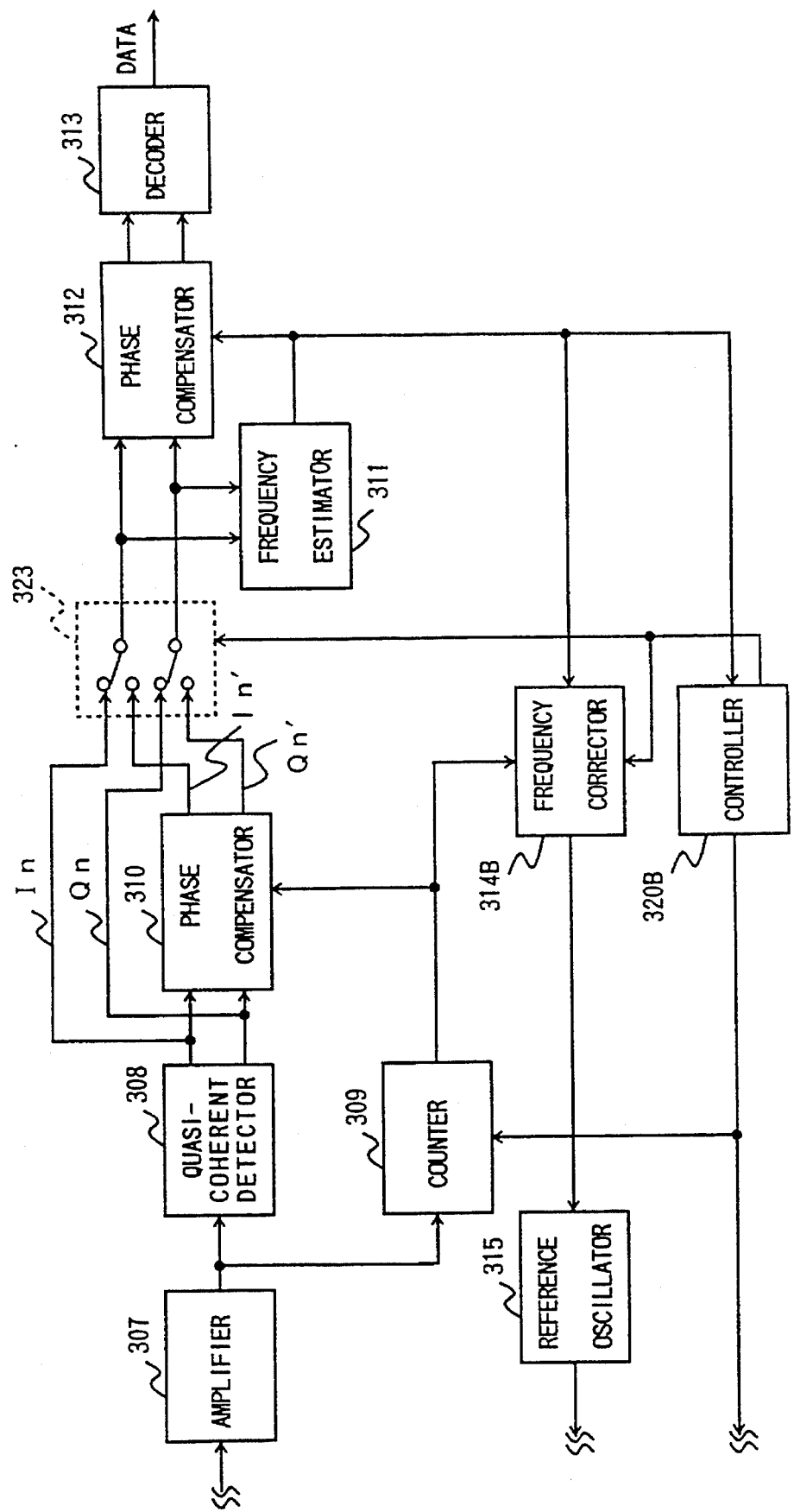
FIG. 13 is a block diagram showing the structure of a mobile communications system according to the eighth embodiment.

The eighth embodiment of the present invention will now be described with reference to FIGS. 13 and 14. FIG. 13 shows the architecture of a mobile communications system, in which the same numbers are quoted to the circuits similar to those of the sixth reference embodiment in FIG. 8. The omitted circuits have the same functions as those of the sixth embodiment. In FIG. 13, a switch 323 selects either combination from the quasi-coherent outputs from the quasi-coherent detector 308, i.e., In and Qn, or the outputs from the phase compensator 310, i.e., In' and Qn', to output them into the frequency estimator 311 and the second phase compensator 312. The estimated value outputted from the frequency estimator 311 is inputted to a controller 320B, which controls the automatic frequency control function and the switch 323. With a frequency corrector 314B, the counted output by the counter 309, the estimated value by the frequency estimator 311, and the control output from the controller 320 are transmitted so as to control the oscillation frequency of the reference oscillator 315.

The feature of the this embodiment is the combination of the sixth and seventh embodiments described above. Namely, in the eighth embodiment, when the power is turned ON, the accuracy of the reference oscillator 315 is improved by providing the phase compensator 310 being intervened to compensate the frequency error of the second local oscillator 319, estimating the frequency error of the reference oscillator 315 by the frequency corrector 314B, and controlling the reference oscillator 315 by the frequency corrector 314B. Then, the switch 323 is switched by the controller 320B so as not to intervene the phase compensator 310. The switch is changed by the instruction from the controller 320B dependent on the condition where the signal is being received or not, where the predetermined time is lapsed, or where the frequency error becomes less than the predetermined value by monitoring the estimated value outputted from the frequency estimator 311. Further, when the frequency error becomes larger, the switch 323 may be rechanged to intervene the phase compensator 310 by monitoring the estimated value outputted from the frequency estimator 311. In this case, the frequency corrector 314B changes the operations with respect to the frequency error according to the case in which the phase compensator 310 is intervened or the case in which the phase compensator 310 is not intervene. Namely, when the phase compensator 310 is intervened, the oscillation frequency control signal is outputted based upon the frequency error from the frequency estimator 311. On the other hand, when the phase compensator 310 is not intervened, the oscillation frequency control signal is outputted based upon the frequency signal obtained on the basis of the counted value by the counter 309 and the frequency error given by the frequency estimator 311.

Figure 14:
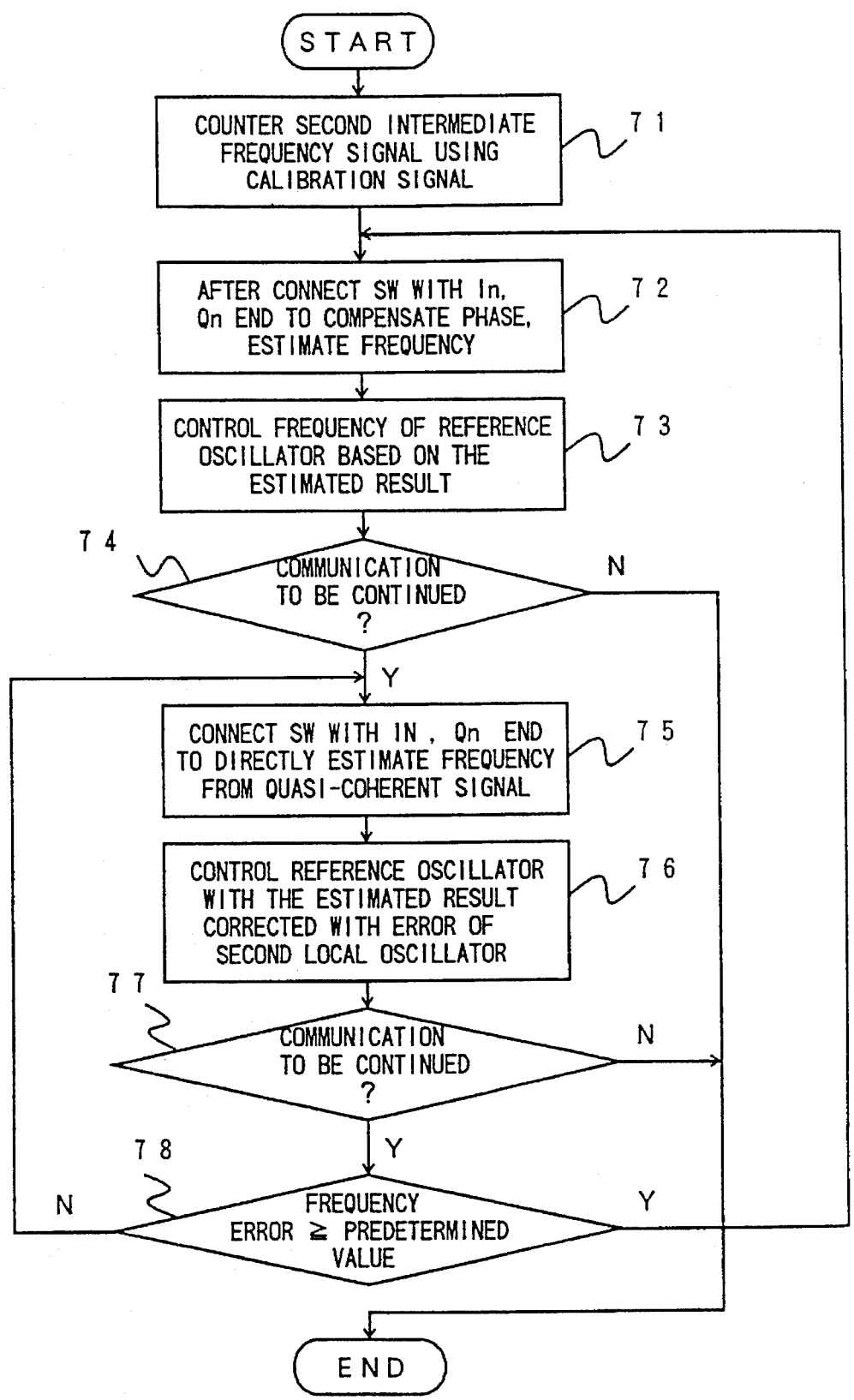
FIG. 14 is a flowchart of an automatic frequency control processing according to the eighth embodiment.

The operation flow of the automatic frequency control processing with the above mentioned structure is shown in FIG. 14. The operation flow in FIG. 14 shows the case where the base station is communicated with a plurality of mobile communications systems in the time division multiplex. The processing unit of the frequency estimator 311 is a slot allocated by time sharing division, and operation is performed corresponding to the burst reception.

Initially, the calibrating signal is outputted from the calibration signal generator 317. The calibration signal is converted into the second frequency signal with the frequency converter 306, and then is counted with the counter 309 (process 71). The output by the counter 309 is inputted into the phase compensator 310 and the frequency corrector 314B. Next, the switch 323 is connected to the end of outputs In' and Qn' of the phase compensator 310 by the controller 320B, thereby starting the operation. In the phase compensator 310, the frequency error of the second local oscillator 319 is estimated with respect to the quasi-coherent demodulation signal of the quasi-coherent detector 308, based on the predetermined value which is counted before hand and outputted from the counter 309, to perform the corresponding phase compensation. Then, the frequency error is outputted to the frequency estimator 311 through the switch 232, where the remaining frequency error is estimated, and then sent to the frequency corrector 314B (process 72).

In this event, the frequency corrector 314 controls the reference oscillator 315 by means of the oscillation frequency control signal, based upon the frequency error from the frequency estimator 311 (Process 73). Then, the controller 320B determines the communication to be continued (Process 74). When the communication is determined to be continued, the switch 323 is connected to the end of the quasi-coherent demodulation signals In and Qn of the quasi-coherent detector 308, and the frequency error of the received signal is estimated with the frequency estimator 311 including the frequency error of the second local oscillator 319 (Process 75).

Upon receipt of the instruction from the controller 320, the frequency corrector 314B controls the reference oscillator 315 in such a manner that the signal for controlling the oscillation frequency given from the output from the frequency estimator 311, is corrected with the correction value determined based upon the counted value (process 76). Next, the controller 320 determines the communication to be continued (process 77). When the subsequent allocated slot is received in succession, the estimated output of the frequency estimator 311 is determined whether it exceeds a predetermined value or not, which is in advance set by the controller 320B (process 78). When the frequency error is increased and exceeds the predetermined value, the next processing is started from the process 72. On the other hand, if the frequency error is not greater than the predetermined value, the next step is repeated from the process 75.

Consequently, in the eighth embodiment, prior to performing the automatic frequency control, the first phase compensator 310 is intervened provided for the case where the variation of the first local oscillation frequency with the base station frequency is large. Accordingly, the frequency error of the second local oscillator 319 is compensated to suppress the frequency error of the quasi-coherent demodulation signal to be inputted into the frequency estimator 311, thereby reducing the rate which may cause the frequency error. Further, after the deviation of the first local oscillation frequency from the base station is reduced by performing the automatic frequency control once, the processing by the first phase compensator 310 is omitted and the error component with respect to the second local oscillator 319 is corrected with the frequency corrector 314B, which is intended to consume lower power. Furthermore, when the frequency error is increased on the way of communication, the automatic frequency control is performed such that the first phase compensator 310 is again intervened.

Figure 15:
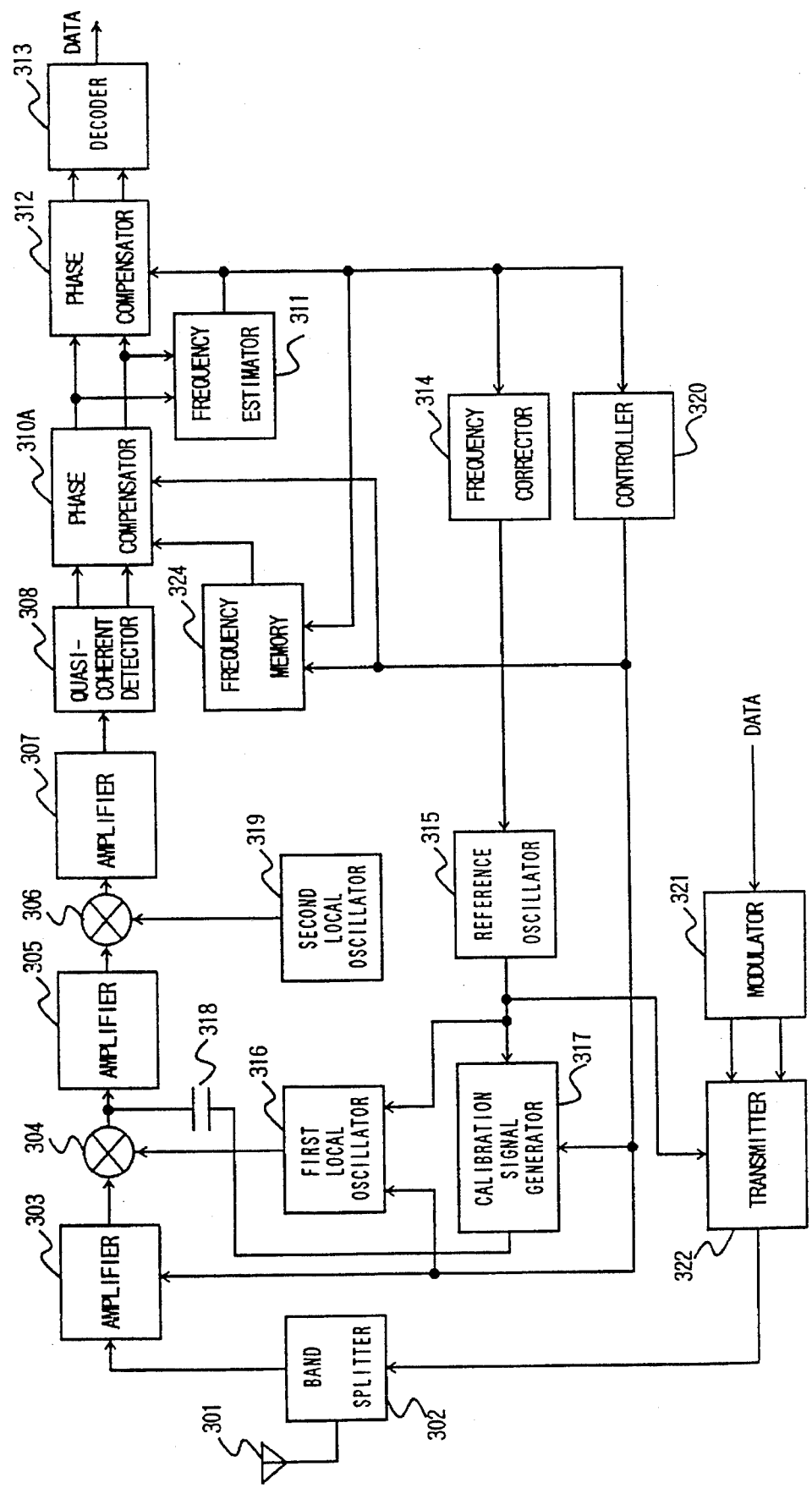
FIG. 15 is a block diagram showing the structure of a mobile communications system according to the ninth embodiment.

The ninth embodiment of the present invention will now be described with reference to FIG. 15 showing the structure of the mobile communications system. In FIG. 15, the same reference numbers are used to the circuits similar to those of the sixth embodiment. A frequency memory 324 stores the estimated value of the frequency error outputted from the frequency estimator 311. A phase compensator 310A performs the phase compensation with respect to the quasi-coherent demodulation signal of the quasi-coherent detector 308 based upon the estimated value outputted from the frequency memory 324. Its purpose is to compensate the frequency error of the second local oscillator 319, similar to the phase compensator 310, without providing the counter. In this case, the frequency estimating and correcting device can include the frequency estimator 311, the frequency memory 324, the frequency corrector 314, and the phase compensator 310A.

Figure 16:
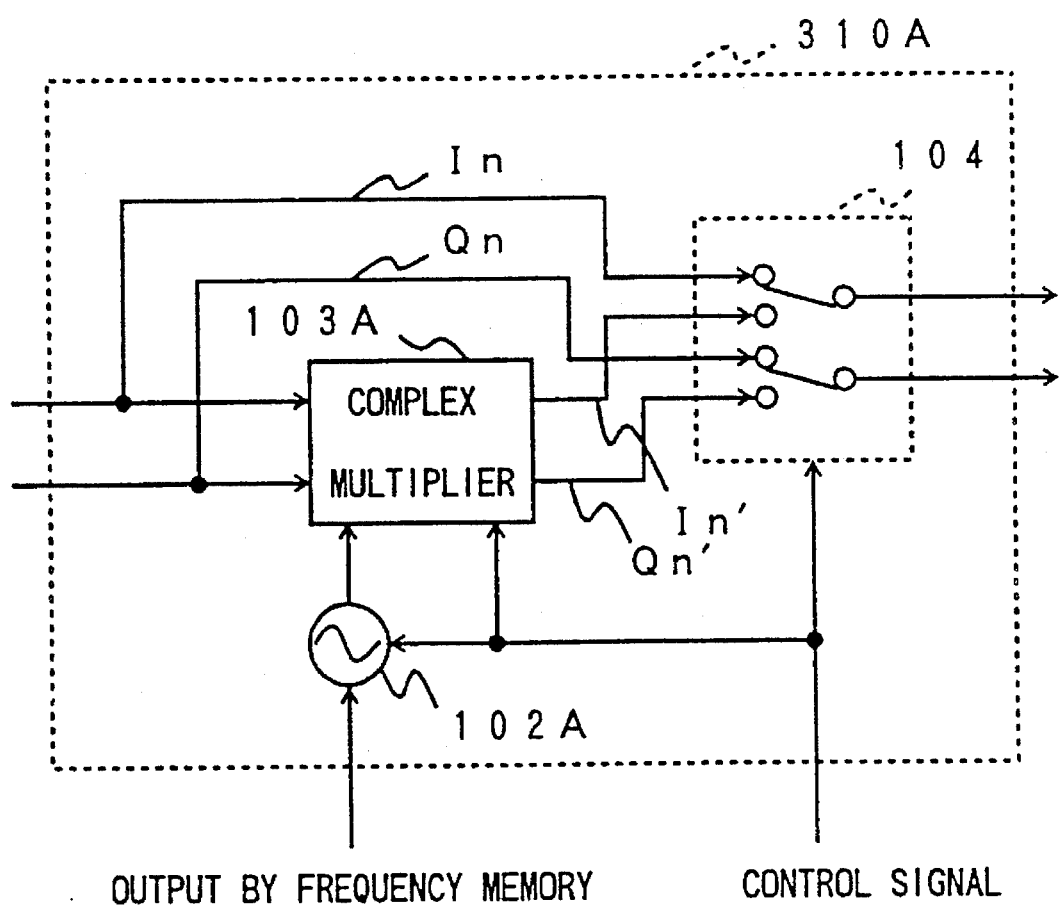
FIG. 16 is a block diagram showing the structure of a phase compensator 310A.

The interior of the phase compensator 310A is shown in FIG. 16, wherein a digital oscillator 102A generates a phase compensation signal for compensating the phase based on the output of the frequency memory 324. A complex mutiplier 103A performs multiplication of the complex numbers of quasi-coherent demodulation signals In and Qn and the phase compensation signal from the digital oscillator 102A, and a switch 104 selects either one combination of complex multiplier outputs In' and Qn' or the quasi-coherent detector outputs In and Qn, as the output of the phase compensator 310A. The selection of the switch 104 is controlled by the instruction from the controller 320 (FIG. 15). When the quasi-coherent demodulation signals In and Qn are selected by the controller 320, the operations of complex multiplier 103A and the digital oscillator 102A are stopped, resulting in the low power consumption. In the ninth embodiment, the frequency error A of the second local oscillator 319 can be estimated by the frequency estimator 311 by providing the phase compensator 310A.

Figure 17:
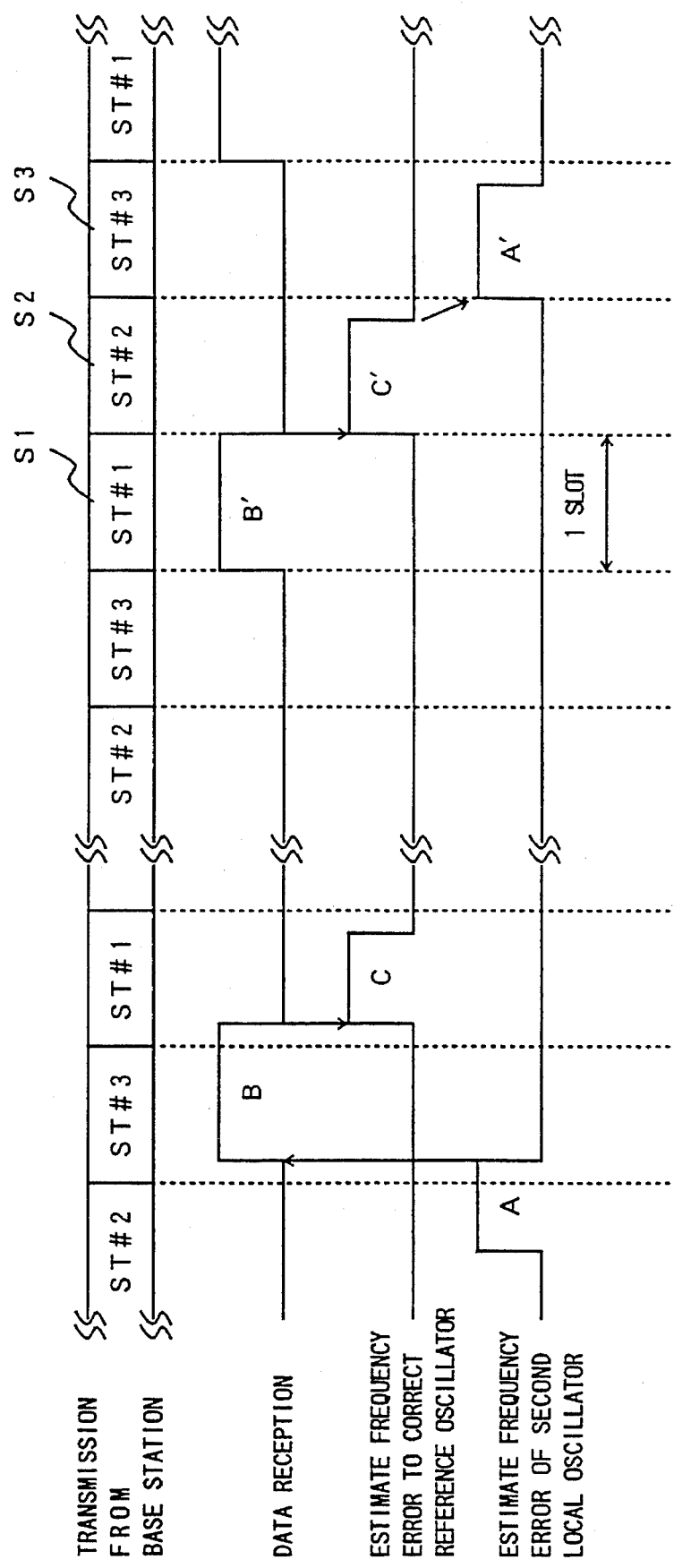
FIG. 17 is a timing chart showing an automatic frequency control processing according to the ninth embodiment.

FIG. 17 is a timing chart showing the relationship between the appreciation of the second local oscillator 319 and the operation of following up the base station. There is shown the example in which the base station carries out time division communication with the three mobile communications systems with a single frequency channel. In FIG. 17, S1, S2, and S3 indicate timing slots for time division. The operation of controlling the frequency will now be described with reference to FIGS. 17 and 18.

When the power is turned ON, during the section A, the calibration signal generator 317 is initially operated by the controller 320, and the calibration signal generated based on the reference oscillator 315 is outputted by the calibration signal generator 317. Then, the calibration signal is converted into the second intermediate frequency signal by the second frequency converter 306, and the second intermediate frequency signal is quasi-coherent detected by the quasi-coherent detector 308, so as to estimate the frequency error of the second local oscillator. In the phase compensator 310A, the switch 104 shown in FIG. 16 selects and outputs the quasi-coherent demodulation signals In and Qn according to the instruction from the controller 320. The frequency estimator 311 estimates the frequency error of the second local oscillator 319 based on the output from the phase compensator 310A (Process 1101), and the estimated frequency error is stored in the frequency memory 102A.

Then, in the section B, the signal is received from the base station during the predetermined period. In the section C, the frequency of the reference oscillator 315 is corrected so as to follow the frequency of the base station (process 1102). The switch 104 selects the In' and Qn' which are outputted from the complex multiplier 103A in FIG. 16. The digital oscillator 102A in FIG. 16 generates the compensation signal as represented by the equation (4) described with reference to the sixth embodiment, based on the stored value in a frequency memory 324. Then, the signals In' and Qn', which compensate the phase rotation caused by the frequency error of the second local oscillator in the complex multiplier 103A are inputted to the frequency estimator 311. The remaining frequency error is estimated by the frequency estimator 311, and the thus estimated frequency error is inputted into the frequency corrector 314 so that the reference oscillator 315 is controlled with respect to the oscillation frequency to minimize the frequency error. That is, based upon the frequency error appreciated in the section A, the frequency error of the receiving frequency is estimated by the frequency estimator 311 using the signal which compensates the phase.

Subsequently, the controller 320 determines the communication is determined to be continued (process 1103). When the communication is determined to be continued, the calibration signal is outputted to reestimate the frequency error of the second local frequency 319 during the idle time of the timing slot, thereby updating the stored value of the frequency memory 324 (process 1104). In this manner, the estimated value of the frequency error of the second local oscillator can be successively corrected accompanied by the frequency controlling operation to follow the base station. The converge of the estimated value of the frequency error is determined by the frequency estimator 311 (process 1105). The converge of the estimated value means that, in this case, the estimated value with respect to the second intermediate frequency by the frequency estimator 311 is closer to the reference value, and the convergence is determined by predetermining the frequency error value for convergence. The frequency estimator 311 notifies to the controller 320 the determined result, accordingly to which, the controller 320 issues the instruction to the the respective circuits, so that the processes from 1102 to 1104 are repeated until the dispersion of the estimated error of the second local oscillator is converged within the permissible range. After the convergence is determined by the controller 320, the reference oscillator 315 is controlled at the timings as indicated as the sections B' and C', to follow the variation of the base station, is controlled (process 1106). That is, as the usual time division communication is performed after the slot synchronization with the base station is established, the signal from the base station is received in the section B', and the frequency error is estimated in the section C', to correct the frequency accuracy of the oscillation frequency of the reference oscillator 315. Then, the continuation of the communication is determined (process 1107). When the communication is to be continued, the increase of the frequency error is further determined (process 1108). When the frequency error is estimated that exceeds a predetermined value, the operation is returned to the process 1102 where the frequency error of the second local oscillator 319 is reestimated by using the calibration signal generated on the basis of the corrected reference oscillator 315 in the section A'. When the estimated frequency error is within the predetermined value, the operation is repeated from the process 1106 to control the reference oscillator 315 at the timing shown in the sections B' and C', as described above. As shown in FIG. 17, when the slot S1 in the section B' is the timing slot allocated by the base station, the processing to be performed in the sections C' and A' are completed within the idle slot period of the slots S2 and S3, thereby continuing the time division communication smoothly.

Figure 18:
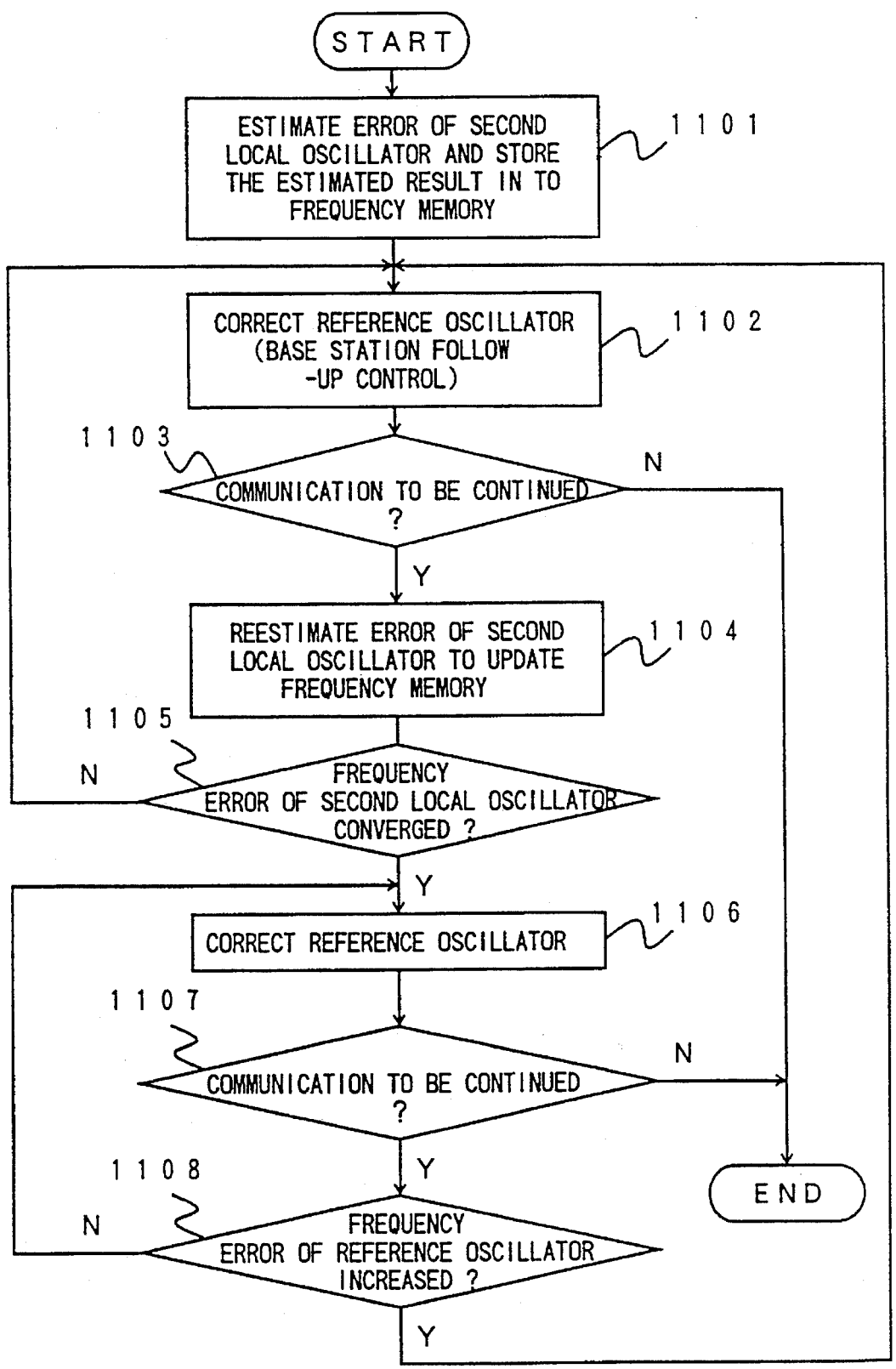
FIG. 18 is a flowchart of an automatic frequency control processing according to the ninth embodiment.

According to the flowchart in FIG. 18, the reestimate with respect to the second local oscillator 319 is activated as needed, and can be omitted in the normal communication condition, Therefore, the power consumption can be reduced.

According to the ninth embodiment, since the estimate with respect to the second local oscillator 319 is also performed by the frequency estimator 311 by means of the operational method, the automatic frequency control can be activated at high speed. Further, the counter 309 can be reduced in size, resulting in minimizing the entire circuit in size.

Figure 19:
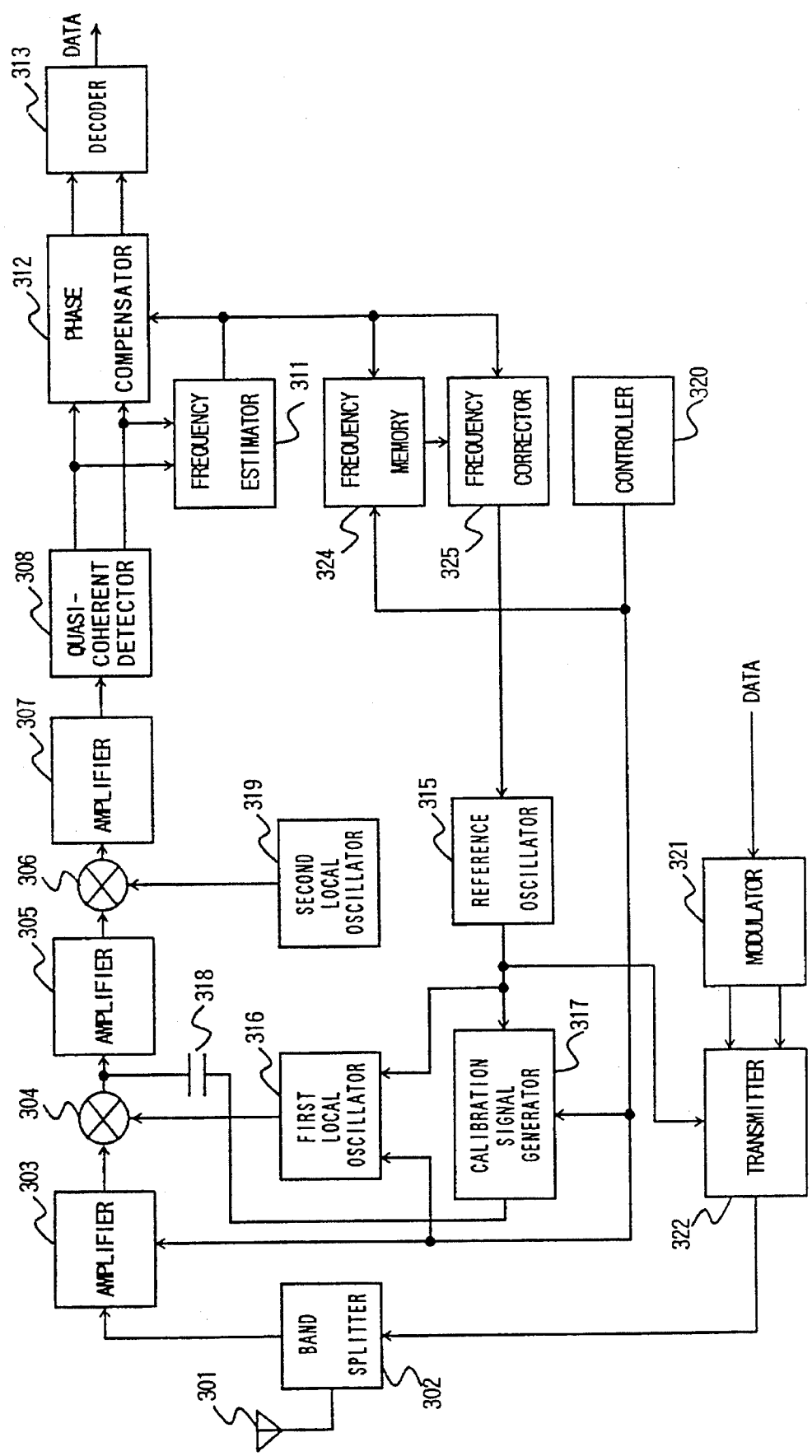
FIG. 19 is a block diagram showing the structure of a mobile communications system according to the tenth embodiment.

The tenth embodiment of the present invention will now be described with reference to FIG. 19. In FIG. 19, numeral 325 indicates a frequency corrector, and other circuits are numbered the same reference number as the ninth embodiment. The difference of this embodiment and the ninth embodiment is that: (1) the phase compensator 310A in the ninth embodiment is omitted; (2) the quasi-coherent signal output is directly inputted both into the frequency estimator 311 and the second phase compensator 312; and (3) the output from the frequency memory 324 is inputted into the frequency corrector 325. Both the output value from the frequency memory 324 and the output signal from the frequency estimator 311 are inputted to the frequency corrector 325 to control the oscillation frequency of the reference oscillator 315. Namely, the result subtracting the output value from the frequency memory 324 from the output of the frequency estimator 311 being used as the relative frequency error with respect to the base station oscillator, the frequency error is controlled to be minimized with respect to the reference oscillator 315. The estimated frequency error of the second local oscillator 319 is stored in the frequency memory 324 in the same manner as described in the ninth embodiment. In the tenth embodiment, the operational processing in the phase compensator 310A is omitted, thereby reducing the power consumption.

Figure 20:
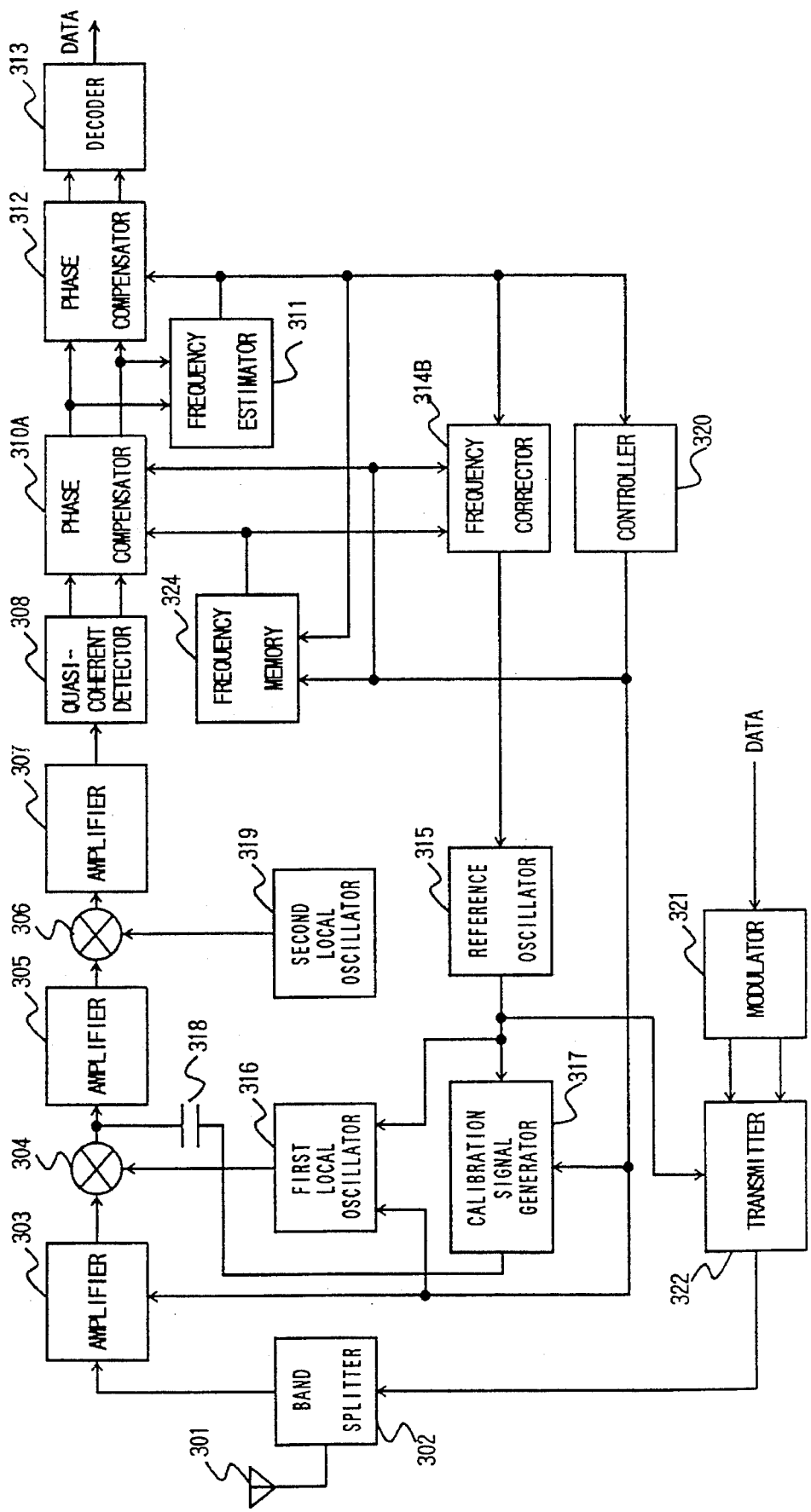
FIG. 20 is a block diagram showing the structure of a mobile communications system according to the eleventh embodiment.

The eleventh embodiment of the present invention will now be described in connection with FIG. 20 which shows the structure of a mobile communications system in which the ninth and the tenth embodiments are combined. Same reference numbers are quoted to the same circuits as those of the ninth and tenth embodiments. This embodiment includes the phase compensator 310A explained with reference the ninth embodiment and the frequency corrector 314B in the eighth embodiment. The output from the frequency memory 324 is to be transmitted both to the phase compensator 310A and the frequency corrector 314B. The frequency corrector 314B controls, when the instruction is sent from the controller 320, the oscillation frequency of the reference oscillator 315 such that the frequency error resulted from subtracting the output of the frequency memory 324 from the output of the frequency estimator 311 is minimized. While, the frequency corrector 314B controls, when no instruction is sent from the controller 320, the oscillation frequency of the reference oscillator 315 such that the frequency error directly obtained from the output of the frequency estimator 311 is minimized. Further, the processing of estimating the frequency error of the second local oscillator to be stored in the frequency memory 324, and the updation of the stored value, are performed in the same manner as in the ninth embodiment.

The feature of this embodiment lies in that the first and second modes are selected by changing the switch 104 (FIG. 16) within the phase compensator 310A, in connection with the base station following-up control. In the first mode, the switch 104 selects the the outputs In' and Qn' of the complex multiplier 103' (FIG. 16). The frequency estimator 311 estimates the remaining frequency error by using the result from compensating the phase rotation caused by the frequency error of the second local oscillator 319, and directly controls the reference oscillator 315 so as to reduce the estimated output. In the second mode, the switch 104 selects the quasi-coherent demodulation signal outputs In and Qn. The frequency estimator 311 performs the estimate with respect to these signals In and Qn, and controls the reference oscillator 315 such that the result subtracting the output of the frequency memory 324 from the output of the frequency estimator 311 is minimized in the frequency corrector 314B.

The transition of the first and second modes are operated as follows. The operation of the automatic frequency control is proceeded similar to the operation flow shown in FIG. 18. The operation in the first mode is performed until the converge of the estimated result of the second local oscillator is determined in the process 1105. And the automatic frequency control in the second mode is performed after the process 1106 in FIG. 18. Accordingly, the transition from the second mode to the first mode is performed by detecting the increase of the frequency error by the controller 320.

According to the eleventh embodiment, similar to the ninth embodiment, prior to performing the automatic frequency control, the first phase compensator 310A is intervened provided for the case where the variation of the first local oscillation frequency with the base station frequency is large. Accordingly, the frequency error of the second local oscillator 319 is compensated to reduce the frequency error of the quasi-coherent demodulation signal to be inputted into the frequency estimator 311, thereby reducing the rate which may cause the frequency error.

Further, by performing the automatic frequency control once, the deviation of the first local oscillation frequency with the base station is reduced. Furthermore, after the estimated value of the frequency error of the second local oscillator is converged, the processing by the phase compensator 310A can be omitted, and the processing of estimating the frequency error of the second local oscillator 319 and the updation of the stored value in the frequency memory 324 can be stopped, making it possible to consume lower power.

Furthermore, since the estimate of the second local oscillator is performed by the operational processing, the activation of the automatic frequency control can be carried out at high speed. Also, the circuit can be reduced in size, similar to the ninth embodiment.

Figure 21:
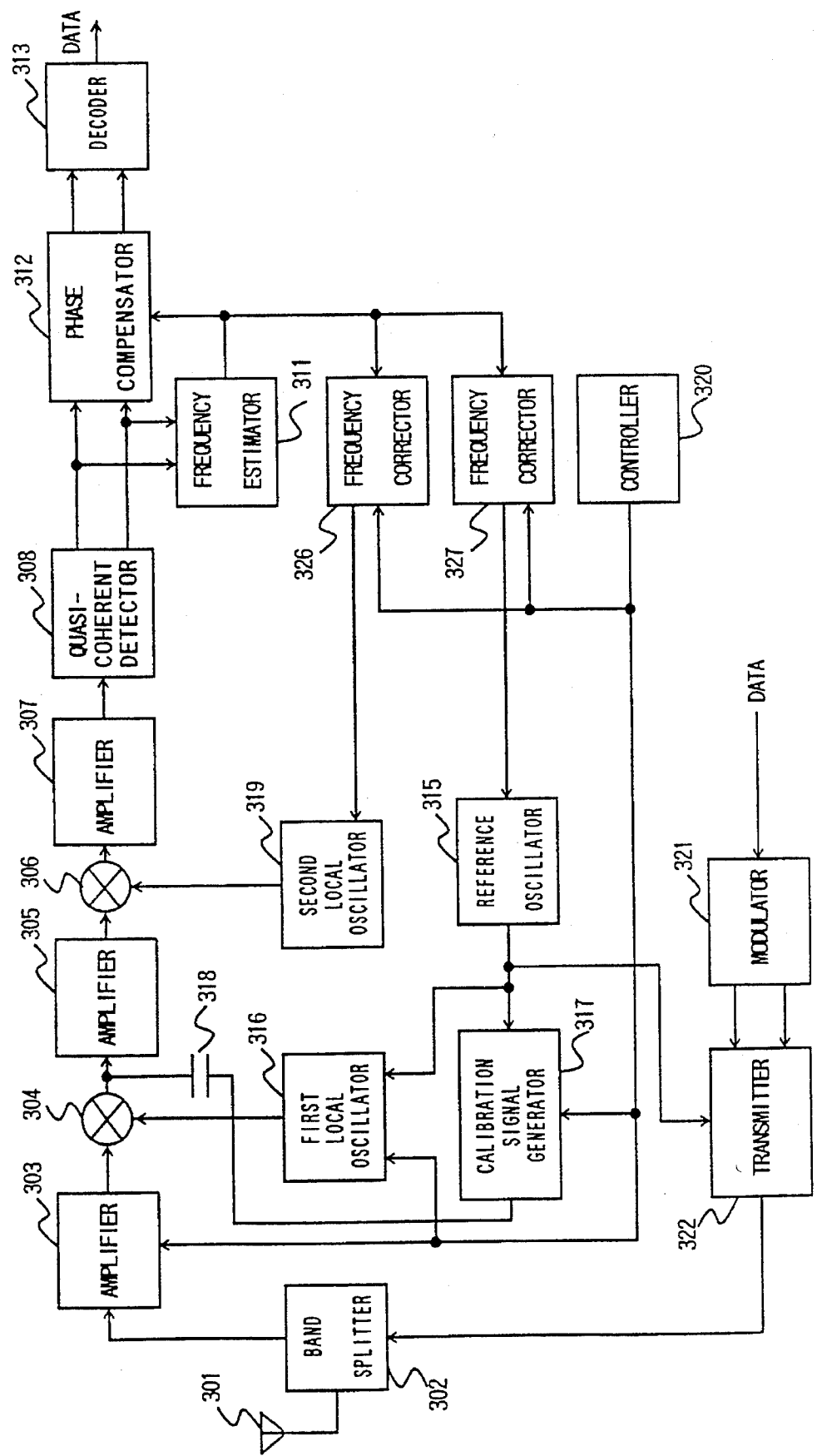
FIG. 21 is a block diagram showing the structure of a mobile communications system according to the twelfth embodiment.

The twelfth embodiment of the present invention will now be described in associated with FIG. 21. In FIG. 21, the circuits operated similar to those shown in the sixth embodiment are quoted using the same reference number. A second local oscillator 319' is capable of fine-controlling the oscillation frequency externally. The estimated value outputted from the frequency estimator 311 is inputted into both frequency correctors 326 and 327, each of which outputs the oscillation frequency control signal in order to minimize the estimated value. The frequency corrector 326 controls the second local oscillator 319' while the frequency corrector 327 controls the reference oscillator 315.

The oscillation frequency control signals outputted by the frequency correctors 326 and 327 are transmitted to the second local oscillator 319' and the reference oscillator 315, respectively. Further, the quasi-coherent demodulation signal outputted from the quasi-coherent detector 308 is directly inputted into the frequency estimator 311 and the phase compensator 312, similar to the tenth embodiment. The frequency corrector 326 is controlled by the controller 320 with respect to the input timing such that the estimated result of the frequency error of the second local oscillator 319' by using the calibration signal is inputted thereto. The frequency corrector 327 is controlled by the controller 320 with respect to the input timing such that the estimated result of the frequency estimator 311 is inputted thereto upon receiving the signal from the base station.

According to this embodiment, as similar to the tenth embodiment, the frequency error of the second local oscillator 319' is estimated, and the oscillation frequency of the second local oscillator 319' is corrected by the frequency corrector 326 with the frequency accuracy of the reference oscillator 315. Next, the signal transmitted from the base station is received, and the frequency error of the received signal is estimated by the frequency estimator 311, and the reference oscillator 315 is controlled so as to reduce the deviation of the base station by the frequency corrector 327.

When the above operation is completed, the difference between the reference oscillation 315 and the second local oscillator 319' is estimated at the timings of sections B', C' and A' in the timing chart shown in FIG. 17 described in associated with the ninth embodiment, and the oscillation frequency is corrected accordingly. In this way, the frequency is controlled to follow the variation of the base station.

According to the twelfth embodiment, prior to the receiving operation, the frequency error of the second local oscillator 319' is controlled. Therefore, on receiving the signal from the base station, the frequency error of the quasi-coherent demodulation signal to be inputted in the frequency estimator 311 is reduced, thereby reducing the ratio which may causes the frequency error.

In addition, as a still another embodiment (not shown), the phase compensator 310 in FIG. 8 is omitted, and the value counted by the counter 309 is inputted to the frequency estimator 311. In this case, the frequency estimator functions as extracting the phase rotation caused by the frequency error, from the quasi-coherent demodulation signal at each modulation symbol. With respect to the extracted phase rotation, the phase rotation corresponding to the frequency error which is obtained based upon the value outputted from the counter 309, is subtracted, and the frequency estimating operation is carried out based on the thus corrected extraction. According to the embodiment described above, the same effect as the sixth embodiment can be obtained.

According to the communication system of present invention, as described, the frequency error of the second local oscillator can be initially estimated with the frequency accuracy of the reference oscillator. Accordingly, the base station follow-up accuracy of the reference oscillator can be improved by the oscillation frequency control signal, which calibrates the reference oscillator on the basis of the oscillation frequency of the base station. In calibrating the reference oscillator, the reference oscillator is correctly calibrated by using any one of the following methods, that is: (1) correcting the receiving frequency using the frequency error estimated value of the second local oscillator; (2) correcting the receiving frequency when the oscillation frequency control signal is outputted; or (3) directly calibrating the second oscillator.

Since the accuracy of the reference oscillator is improved by the operation of following the base station, the accuracy of the estimated frequency error of the second local oscillator is successively improved.

Further, when the transmission frequency is set using the reference oscillator, the accuracy of the sending frequency is improved.

According to the communication system of the present invention, the frequency error of the second local oscillator is initially estimated with the frequency accuracy of the reference oscillator. Based on the oscillation frequency of the base station, the error of the reference oscillator is obtained correctly, and therefore, the accuracy of following the base station in the reference oscillator can be improved.

The present invention can provide the communication system which is capable of following the oscillation frequency of the base station with high accuracy, taking into consideration the frequency error of the plurality of the local oscillators.

What is claimed is:

1. A mobile communication system comprising:

a receiving section which includes first and second local oscillating means each for generating first and second local oscillation signals, respectively, first frequency converting means for converting a received signal into a first intermediate frequency signal by mixing with said first local oscillation signal, second frequency converting means for converting the received signal converted into said first intermediate frequency signal into a second intermediate frequency signal by mixing with said second local oscillation signal, reference frequency oscillating means for generating a reference signal having a predetermined reference frequency, calibration signal generating means for generating a calibration signal based on said reference signal generated from said reference frequency oscillating means, and a demodulator for demodulating the received signal converted into said second intermediate frequency signal;

a transmission section for modulating a transmission signal; and an input/output section for receiving the demodulated signal and outputting the transmission signal, wherein said receiving section has frequency control means for controlling an oscillation frequency of said reference frequency of said reference frequency oscillating means based on the received signal converted into said second intermediate frequency signal, and correcting means for correcting said second local oscillating means based on a calibration signal converted into said second intermediate frequency signal in which said calibration signal from said calibration signal generating means is inputted to an input of said second frequency converting means;

said first local oscillating means generates said first local oscillation signal based on the controlled reference signal of said reference frequency oscillating means; and said calibration signal generating means generates said calibration signal which is controlled based on said reference signal generated by the controlled reference frequency oscillating means.

2. A mobile communication system as defined in claim 1, wherein said calibration signal generating means further generates a signal for modulating the transmission signal at said transmission section and further includes switching means for switching the generation of said calibration signal and said signal at said calibration signal generating means.

3. A mobile communication system as defined in claim 1, wherein:

said receiving section further includes counter means for counting either the received signal converted into said second intermediate frequency signal by said second frequency converting means or the calibration signal converted into said second intermediate frequency signal;

said frequency controlling means generates a frequency controlling signal for controlling said oscillation frequency of said reference signal of said reference frequency oscillating means based on frequency error between a counted value of the received signal converted into said second intermediate frequency signal counted by said counter means and a predetermined intermediate frequency reference value; and said reference frequency oscillating means is controlled with respect to said oscillation frequency of said reference signal based on said frequency controlling signal.

4. A mobile communication system as defined in claim 1, further comprising:

controlling means for instructing said calibration signal generating means to activate generation of said calibration signal.

5. A mobile communication system as defined in claim 4, wherein said controlling means instructs said calibration signal generating means to activate generation of said calibration signal at a regular period of time.

6. A mobile communication system as defined in claim 4, wherein said controlling means monitors whether or not communication is being carried out in said communication system and issues a command for generating said calibration signal to said calibration signal generating means when communication is not being carried out.

7. A mobile communication system as defined in claim 1, further comprising:

temperature sensing means for instructing said calibration signal generating means to activate generation of said calibration signal in a case where a temperature reaches a predetermined temperature.

8. A mobile communication system as defined in claim 1, wherein said first frequency converting means and said second frequency converting means are provided in a double structure, and said mobile communication system further comprising:

calibration signal switching means for inputting the generated calibration signal at said calibration signal generating means into said second frequency converting means which has received no received signal.

9. A communication system comprising a receiving section which includes first frequency converting means for converting a received signal into a first intermediate frequency signal by mixing with a first local oscillation signal, second frequency converting means for converting the received signal converted into said first intermediate frequency signal into a second intermediate frequency signal by mixing the received signal converted into the first intermediate frequency signal with a second local oscillation signal, a demodulator for demodulating the received signal converted into the second intermediate frequency signal, a transmission section for modulating a transmission signal and an input/output section for receiving the demodulated signal from the receiving section and outputting it externally and receiving the transmission signal externally and outputting it to the transmission section, said receiving section including:

reference frequency generating means for generating a reference signal;

calibration signal generating means for generating a calibration signal of said first intermediate frequency based on said reference signal; and frequency estimating and correcting means for detecting a frequency error of said reference frequency generated by said reference frequency generating means and outputting an oscillation frequency control signal to said reference frequency generating means based on the detected frequency error, said reference frequency generating means being controlled based on said oscillation frequency control signal, with respect to an oscillation frequency of said reference signal, said second frequency converting means converting, in addition to the received signal converted into said first intermediate frequency signal, said calibration signal of said first intermediate frequency signal into a second intermediate calibration frequency signal by mixing said calibration signal of said first intermediate frequency signal with said second local oscillation signal; and said frequency estimating and correcting means detecting a frequency error A between said second intermediate frequency calibration signal converted by said second frequency converting means and a predetermined reference intermediate frequency, detecting a frequency error C which is determined by subtracting the frequency error A from a frequency error B which is a frequency difference between the received signal converted into said second intermediate frequency signal and said predetermined reference intermediate frequency and outputting said oscillation frequency control signal based on the detected frequency error C.

10. A communication system as defined in claim 9, wherein said frequency estimating and correcting means includes:

a first frequency estimator for detecting the frequency error A;

a phase compensator for correcting a phase of the received signal converted into said second intermediate frequency signal converted by the second frequency converting means based on said frequency error A detected by said first frequency estimator;

a second frequency estimator for detecting said frequency error C and outputting a frequency error signal based on said frequency error C; and frequency correcting means for outputting the oscillation frequency control signal to said reference frequency generating means based on said frequency error signal outputted from said second frequency estimator, said second frequency estimator corrects a phase of the received signal converted into said second intermediate frequency signal based on said frequency error A so as to detect said frequency error C from the received signal converted into said second intermediate frequency signal having a corrected phase and the predetermined reference intermediate frequency.

11. A communication system as defined in claim 9, wherein said frequency estimating and correcting means includes:

a first frequency estimator for detecting said frequency error A to be outputted;

a third frequency estimator for detecting said frequency error B; and frequency correcting means for detecting said frequency error C to output said oscillation frequency control signal to said reference frequency generating means based on the detected frequency error C, said frequency correcting means detecting said frequency error C based on said frequency error A outputted from said first frequency estimator and said frequency error B outputted from said third frequency estimator.

12. A communication system as defined in claim 9, wherein said frequency estimating and correcting means includes:

a first frequency estimator for detecting said frequency error A;

a phase compensator for correcting a phase of the received signal converted into said second intermediate frequency based on said frequency error A detected by said first frequency estimator;

a second frequency estimator for detecting said frequency error C to be outputted; and frequency correcting means for outputting said oscillation frequency control signal to said reference frequency generating means based on said frequency error C, said phase compensator further including a first mode in which a phase of the received signal converted into said second intermediate frequency is corrected and a second mode in which the received signal converted into said second intermediate frequency signal is outputted without being corrected, and selector means for selecting either one of said modes according to a predetermined condition, said frequency correcting means correcting a phase of the received signal based on said frequency error A so as to detect said frequency error C from the received signal converted into said second intermediate frequency signal having a corrected phase and the predetermined reference intermediate frequency and outputting said oscillation frequency control signal to said reference frequency generating means.

13. A communication system as defined in claim 12, wherein said selector means selects, according to said predetermined condition said first mode in a case where said frequency error A is larger than a predetermined value, and said second mode in the other cases.

14. A communication system as defined in claim 9, wherein said frequency estimating and correcting means includes:

a frequency estimator for detecting the frequency error A;

a frequency memory for storing the frequency error A; and frequency correcting means for outputting the oscillation frequency control signal to the reference frequency generating means, said frequency estimator detecting the frequency error B between the received signal converted into the second intermediate frequency and the reference intermediate frequency to output a frequency error signal, said frequency correcting means detecting the frequency error C on the basis of the frequency error A stored in the frequency memory and the frequency error B detected by the frequency estimator, to output the oscillation frequency control signal.

15. A communication system as defined in claim 9, wherein said frequency estimating and correcting means includes:

a frequency estimator for detecting the frequency error A;

a frequency memory for storing the frequency error A;

a phase compensator for compensating a phase of the received signal converted into said second intermediate frequency, on the basis of the frequency error A stored in said frequency memory; and frequency correcting means for outputting the oscillation frequency control signal to the reference frequency generating means, said frequency estimator detecting the frequency error C on the basis of the received signal corrected with said phase compensator and the reference intermediate frequency to output a frequency error signal, said frequency correcting means outputting the oscillation frequency control signal to the reference frequency generating means on the basis of said frequency error signal.

16. A communication system as defined in claim 9, wherein said frequency estimating and correcting means includes;

a frequency estimator for detecting said frequency error A;

a frequency memory for storing said frequency error A;

a phase compensator for compensating a phase of the received signal converted into said second intermediate frequency based on said frequency error A stored in said frequency memory; and frequency correcting means for outputting said oscillation frequency control signal to said reference frequency generating means, said phase compensator further including a first mode in which a phase of the received signal converted into said second intermediate frequency signal is corrected and a second mode in which the received signal converted into said second intermediate frequency signal is outputted without being corrected, and selector means for selecting either one of said modes, said frequency correcting means correcting the phase of the received signal converted into said second intermediate frequency signal on the basis of said frequency error A so as to detect said frequency error C from the corrected received signal converted into said second intermediate frequency signal and the predetermined intermediate frequency and outputting the oscillation frequency control signal to the reference frequency generating means.

17. A communication system as defined in claim 9, wherein said frequency estimating and correcting means detects the frequency error C such that a phase of the received signal converted into the second intermediate frequency is corrected on the basis of said frequency error A, and the frequency error C is detected on the basis of the so corrected received signal and the predetermined reference intermediate frequency.

* * * * *